US012469670B2

(12) United States Patent
Russo et al.

(10) Patent No.: US 12,469,670 B2
(45) Date of Patent: Nov. 11, 2025

(54) ELECTRON MICROSCOPY SUPPORT

(71) Applicant: United Kingdom Research and Innovation, Swindon (GB)

(72) Inventors: Christopher J. Russo, Cambridge (GB); Katerina Naydenova, Cambridge (GB)

(73) Assignee: United Kingdom Research and Innovation, Swindon (GB)

( * ) Notice: Subject to any disclaimer, the term of this patent is extended or adjusted under 35 U.S.C. 154(b) by 497 days.

(21) Appl. No.: 17/914,188

(22) PCT Filed: Mar. 24, 2021

(86) PCT No.: PCT/EP2021/057628
§ 371 (c)(1),
(2) Date: Sep. 23, 2022

(87) PCT Pub. No.: WO2021/191307
PCT Pub. Date: Sep. 30, 2021

(65) Prior Publication Data

US 2023/0131360 A1 Apr. 27, 2023

(30) Foreign Application Priority Data

Mar. 24, 2020 (GB) ..................................... 2004272

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/2001* (2013.01)

(58) Field of Classification Search
CPC .... H01J 37/20; H01J 37/28; H01J 2237/2001; H01J 37/26
See application file for complete search history.

(56) References Cited

U.S. PATENT DOCUMENTS 5,369,241 A 11/1994 Taylor et al.
5,369,336 A 11/1994 Koinuma et al.
(Continued)

FOREIGN PATENT DOCUMENTS

CN 105000552 A 10/2015
CN 105531792 A 4/2016
(Continued)

OTHER PUBLICATIONS

Marr, et al., "Fabrication of carbon films with ~500 nm holes for cryo-EM with a direct detector device", Journal of Structural Biology 185 (2014) 42-47.
(Continued)

*Primary Examiner* — David A Vanore
(74) *Attorney, Agent, or Firm* — Hamilton, Brook, Smith & Reynolds, P.C.

(57) ABSTRACT

A support for an electron microscopy sample, the support comprising a metallic foil having one or more holes therethrough wherein thickness of the metallic foil is less than 50 nm and/or the mean linear intercept grain size is 50 nm or less, wherein the ratio of the diameter of each hole to the thickness of the metallic foil is 15:1 or less, and wherein the metallic foil consists of either (a) one or more metals selected from transition metals, aluminium and beryllium, or an alloy thereof; or (b) degenerately doped silicon wherein the dopant element is selected from boron, aluminium, boron and arsenic at a concentration of $10^{20}$ atoms/cm$^3$ or higher.

17 Claims, 23 Drawing Sheets

(56) References Cited

U.S. PATENT DOCUMENTS

| | | | | |
|---|---|---|---|---|
| 5,369,337 | A | 11/1994 | Yanagi et al. | |
| 5,369,947 | A | 12/1994 | Dummersdorf et al. | |
| 5,370,767 | A | 12/1994 | Miyakuni et al. | |
| 5,372,199 | A | 12/1994 | Cegielski et al. | |
| 5,372,674 | A | 12/1994 | Steinberg | |
| 5,372,862 | A | 12/1994 | Krishnaswamy | |
| 5,374,327 | A | 12/1994 | Imahashi et al. | |
| 5,376,224 | A | 12/1994 | Zarowin | |
| 5,376,332 | A | 12/1994 | Martens et al. | |
| 5,376,591 | A | 12/1994 | Maeda et al. | |
| 5,414,261 | A * | 5/1995 | Ellisman | H01J 37/26 250/397 |
| 5,540,959 | A | 7/1996 | Wang | |
| 5,986,264 | A * | 11/1999 | Grunewald | H01J 37/28 250/492.21 |
| 6,768,110 | B2 * | 7/2004 | Alani | H01J 37/3053 250/306 |
| 9,947,505 | B2 * | 4/2018 | Russo | G01N 33/54393 |
| 10,157,725 | B2 * | 12/2018 | Passmore | H01J 37/20 |
| 11,067,486 | B2 * | 7/2021 | Lamers | B01L 9/523 |
| 2003/0127595 | A1 * | 7/2003 | Nakamura | H01J 37/28 250/311 |
| 2007/0131873 | A1 * | 6/2007 | Allred, Jr. | H01J 37/20 250/440.11 |
| 2010/0081260 | A1 | 4/2010 | Chen | |
| 2010/0243482 | A1 * | 9/2010 | Chao | G01N 1/42 205/792 |
| 2011/0200787 | A1 * | 8/2011 | Regan | H01J 37/20 216/36 |
| 2012/0104253 | A1 | 5/2012 | Tsuneta et al. | |
| 2013/0043387 | A1 * | 2/2013 | Own | H01J 37/26 250/311 |
| 2014/0014495 | A1 | 1/2014 | Dickinson et al. | |
| 2014/0054458 | A1 * | 2/2014 | Own | H01J 37/261 250/311 |
| 2016/0189919 | A1 * | 6/2016 | Passmore | H01J 37/20 29/897 |
| 2016/0203942 | A1 | 7/2016 | Russo et al. | |
| 2017/0271126 | A1 * | 9/2017 | Ji | G02B 21/26 |
| 2018/0017558 | A1 | 1/2018 | Terfort et al. | |
| 2018/0250704 | A1 | 9/2018 | Truica-Marasescu et al. | |
| 2020/0012121 | A1 * | 1/2020 | Wang | G01N 21/6458 |
| 2022/0185674 | A1 | 6/2022 | Russo et al. | |
| 2023/0139070 | A1 * | 5/2023 | Matousek | G01N 21/65 600/407 |
| 2023/0223231 | A1 * | 7/2023 | Bischoff | H01J 37/147 |

FOREIGN PATENT DOCUMENTS

| | | | |
|---|---|---|---|
| CN | 108660426 | A | 10/2018 |
| JP | 2013-239265 | A | 11/2013 |
| JP | 2016-532267 | A | 10/2016 |
| JP | 2016-534508 | A | 11/2016 |
| WO | 2006119521 | A1 | 11/2006 |
| WO | 2011/007492 | A1 | 1/2011 |
| WO | 2011/103424 | A2 | 8/2011 |
| WO | 2013/140822 | A1 | 9/2013 |
| WO | 2014065665 | A1 | 5/2014 |
| WO | 2020/041202 | A1 | 2/2020 |
| WO | 2020/193719 | A1 | 10/2020 |

OTHER PUBLICATIONS

Russo, et al., "Ultrastable gold substrates: Properties of a support for high-resolution electron cryomicroscopy of biological specimens", Journal of Structural Biology 193 (2016) 33-44.

Huang, X. et al., "Amorphous nickel titanium alloy film: a new choice for cryo electron microscopy sample preparation, " bioRxiv, Posted Mar. 2, 2020, doi: https://doi.org/10. 1101/2020.03.02. 963959; 28 pages.

Jia, P. et al., "Large-area freestanding gold nanomembranes with nanoholes," Mater. Horiz., vol. 6; 1005-1012 (2019).

Russo, C.J. and Passmore, L.A., "Ultrastable gold substrates for electron cryomicroscopy," Science, vol. 346; Issue 6215; 1377-1380 (2014).

International Search Report and Written Opinion for International Application No. PCT/EP2021/057628, mailed Jun. 30, 2021.

Search Report for GB Application No. GB2004272.7, issued Mar. 10, 2021.

Ermantraut, E. et al., "Perforated support foils with pre-defined hole size, shape and arrangement," Ultramicroscopy, 74: 75-81 (1998).

Grant-Jacob, J.A. et al., "Design and fabrication of a 3D-structured gold film with nanopores for local electric field enhancement in the pore," Nanotechnology, 27: 1-11 (2018).

Janbroers, S. et al., "Preparation of carbon-free TEM microgrids by metal sputtering," Ultramicroscopy, 109: 1105-1109 (2009).

Naydenova, K. et al., "Multifunctional graphene supports for electron cryomicroscopy," PNAS, vol. 116, No. 24: 11718-11724 (2019).

A. Einstein, Über die von der molekularkinetischen Theorie der Wärme geforderte Bewegung von in ruhenden Flüssigkeiten suspendierten Teilchen, Ann. Phys. (1905), 549-560, 322.

A. J. Noble, et al., Routine single particle CryoEM sample and grid characterization by tomography, May 29, 2018, eLife, 1-42, 7: e34257.

A. K. Geim, Graphene: Status and Prospects, Jun. 19, 2009, Science, 1530-1534, 324.

C. A. Schneider, et al., NIH Image to ImageJ: 25 years of Image Analysis, Nat. Methods (Jul. 2012), 671-675, 9(7).

C. F. Hryc, et al., Accurate model annotation of a near-atomic resolution cryo-EM map, Mar. 21, 2017, Proc Natl Acad Sci USA, 3103-3108, 114: 12.

C. J. Russo, et al., A precision cryostat design for manual and semi-automated cryo-plunge instruments, Review of Scientific Instruments (Nov. 2016), 114302, 87(11).

C. J. Russo, L. A. Passmore, Controlling protein adsorption on graphene for cryo-EM using low-energy hydrogen plasmas, Nat Methods. Jun. 2014, 649-652, 11(6).

C. J. Russo, L. A. Passmore, Progress towards an optimal specimen support for electron cryomicroscopy, Current Opinion in Structural Biology (2016), 81-89, 37.

D. N. Mastronarde, S. R. Held, Automated Tilt Series Alignment and Tomographic Reconstruction in IMOD, Journal of Structural Biology (2017), 102-113, 197(2).

Definition of manifold, accessed online at https://www.merriam-webster.com/dictionary/manifold on Nov. 4, 2024 (Year: 2024).

E. F. Pettersen, et al., UCSF Chimera—A Visualization System for Exploratory Research and Analysis, J. Comput. Chem. (2004), 1605-1612, 25.

Hernandez et al.: "Controlling the local chemical reactivity of graphene through spacial functionalization", Carbon, Elsevier, Oxford, GB, vol. 60, Apr. 9, 2013 (Apr. 9, 2013), pp. 84-93.

J. Dubochet, et al., Cryo-electron microscopy of vitrified specimens, Q. Rev. Biophys. (1988), 129-228, 21, 2.

J. Hattne, et al., Analysis of Global and Site-Specific Radiation Damage in Cryo-EM, May 1, 2018, Structure, 759-766, 26.

J. Zivanov, et al., A Bayesian approach to beam-induced motion correction in cryo-EM single-particle analysis, IUCrJ (2019), 5-17, 6.

J. Zivanov, et al., New tools for automated high-resolution cryo-EM structure determination in RELION-3, Nov. 9, 2018, eLife, 1-22, 7: e42166.

K. Naydenova, C. J. Russo, Determining and Controlling the Surface Properties of Cryo-EM Specimen Supports, Microscopy and Microanalysis (2018), 880-881, 24 (Suppl 1).

K. Naydenova, C. J. Russo, Measuring the effects of particle orientation to improve the efficiency of electron cryomicroscopy, Sep. 20, 2017, Nature Communications, 1-5, 8:62.

Kai Zhang, Gctf: Real-time CTF determination and correction, Journal of Structural Biology (2016), 1-12, 193.

Katerina Naydenova et al.: "Patterned Functionalization of Graphene specimen for CryoEM with a Low-energy Plasma Instrument", Science, Jan. 1, 2014 (Jan. 1, 2014), pp. 1377-1380.

Naydenova, et al., "Patterned Functionalization of Graphene Specimen Supports for CryoEM with a Low-Energy Plasma Instrument,"

(56) References Cited

OTHER PUBLICATIONS post-deadline poster presentation at the Microscopy & Microanalysis 2019 Conference, Aug. 5, 2019, Portland, Oregon.
Naydenova, K. et al., "Multifunctional graphene supports for electron cryomicroscopy," Proceedings of the National Academy of Sciences, vol. 116; No. 24; 11718-11724; Includes Suppl Material (2019).
Pantelic, R. et al., "The application of Graphene as a sample support in Transmission Electron Microscopy," Support in Transmission Electron Microscopy, Solid State Communications, Elsevier, p. 1375-1382 (2012).
Peter B. Rosenthal and Richard Henderson, Optimal Determination of Particle Orientation, Absolute Hand, and Contrast Loss in Single-particle Electron Cryomicroscopy, J. Mol. Biol. (2003), 721-745, 333.
R. M. Glaeser, Proteins, interfaces, and cryo-EM grids, Current Opinion in Colloid and Interface Science (2018), 1-11, 34.
Search Report for GB Application No. GB1904187.0, Graphene Functionalization Method, Apparatus, and Functionalized Graphene Product dated Aug. 6, 2019.
T. Hussain, et al., Large-Scale Movements of IF3 and tRNA during Bacterial Translation Initiation, Cell (2016), 133-144, 167.
Table of Contents, Science 2014; 343: 3-4 (Jan. 3, 2014) (Year: 2014).
X. Li, et al., Electron counting and beam-induced motion correction enable near atomic resolution single particle cryoEM, Nat. Methods (Jun. 2013), 584-590, 10(6).

* cited by examiner

C

D

A

B

C

D

E

D

E

F

ELECTRON MICROSCOPY SUPPORT

This application is the U.S. National Stage of International Application No. PCT/EP2021/057628, filed on Mar. 24, 2021, which designates the U.S., published in English. and claims priority under 35 U.S.C. § 119 or 365 (c) to GB Application No. 2004272.7, filed Mar. 24, 2020. The entire teachings of the above applications are incorporated herein by reference.

FIELD OF THE DISCLOSURE

The present invention relates to an electron microscopy (EM) sample support; a method of manufacturing an electron microscopy sample support; a method of imaging using an electron microscopy sample support and an apparatus operable to perform a method of imaging. The support is particularly useful in cryoEM imaging.

BACKGROUND

Electron microscopy techniques can be used to image a specimen. According to such techniques, a beam of electrons is used to 'illuminate' a specimen. The presence of the specimen in the electron beam results in changes to that beam. The changes to the beam induced by the sample can be examined to create a magnified image of the specimen.

In order to be illuminated by an electron beam, a specimen must be adequately supported in that beam. Often the electrons forming the electron beam have a high energy and it will be appreciated that bombarding an object, for example, a specimen for examination, together with the support holding the specimen in position within the electron beam, may result in physical, chemical and/or electrical changes to the support and/or specimen. Such changes may impact results, including resolution of image, obtained through use of electron microscopy techniques.

In this regard, at least two outstanding problems exist in the field. Firstly, specimen movement at the beginning of electron beam irradiation in particular degrades image quality and removes information about the undamaged molecules from the structure. Thus, all current EM structural determination models have varying degrees of radiation damage incorporated. Secondly, the throughput of modern synchrotron crystallography beam lines vastly exceeds that of current state-of the art electron microscopes, at least in part due to current limitations in EM specimen supports, meaning that although high resolution structure determination for drug discovery and development is feasible by EM techniques, throughput is low so use of this technique is limited in practice.

Ermantraut 1998 describes a carbon support foil ("Quantifoil"®) for cryoEM and aims to minimize the total specimen thickness to eliminate the object distortions arising from interaction with the support structure. The foil has square holes that support ice layers having a thickness down to 32±2.3 nm. One carbon foil is said to be 15 nm thick and it is stated (but not shown) that a hole diameter as small as 500 nm was formed. This corresponds to a hole diameter to thickness ratio of 33.3:1.

Janbroers 2009 describes carbon-free temperature-stable TEM grids. An 80% Au/20% Pd metal film is supported on standard mixed-mesh Au TEM grids. The grids are formed by applying the metal to a carbon-covered TEM grid followed by selective removal of the carbon using plasma cleaning. The circular holes shown in the figures therein are approximately 1.5 μm or more in diameter. The 80% Au/20% Pd metal film thickness was set to 7, 10 or 15 nm. This corresponds to a smallest hole diameter to thickness ratio of 100:1. The average grain size is 8.3 nm±2.0 nm and deposition occurs at room temperature.

Grant-Jacob 2016 describes three-dimensionally structured gold membrane films with nanopores of defined, periodic geometries that are intended to provide spatially localised enhancement of electric fields by manipulation of the plasmons inside the nanopores. Because these films are not flat they are unsuitable for suspending a sample for analysis by electron microscopy. The substrate contains an array of inverted pyramids etched into a 4 mm×4 mm square region on the surface with inverted pyramids of 1.5 μm×1.5 μm square, 1 μm deep with a pitch of 2 μm and a thickness of 100 nm. a nano-sized hole of 50 nm square was milled through the gold film at a specific location in the cavity to provide electric field control which can subsequently used for enhancement of fluorescence or Raman scattering of molecules in the nanopore. This corresponds to a hole diameter to thickness ratio at the tip of the pyramidal structure of 2:1. However, the walls of the hole are not thick enough to support a sample film. The average grain size is ~40 nm and deposition occurs at room temperature.

Jia 2019 describes large-area freestanding gold nanomembranes that are 50 nm or more in thickness with nanoholes through the membrane having a diameter of 250 nm. This corresponds to a hole diameter to thickness ratio of 5:1. However, the gold nanomembranes are formed by room temperature deposition and as a result they do not provide an improvement in image quality as significant as the present invention.

Previous work by the present inventors includes Russo 2014 where a gold specimen support that nearly eliminates substrate motion during irradiation is shown. The support therein is a gold foil having a ~500 Å thickness and 1.2 μm diameter holes in a square pattern. This corresponds to a hole diameter to thickness ratio of 24:1.

Also, in Russo 2016, an all-gold support is described that has a gold foil having a ~400 to 500 Å thickness and micrometer diameter holes. This corresponds to a hole diameter to thickness ratio of at least 20:1.

All of the known gold support foils mentioned above are at least 500 Å thick. This is because foils of below about 500 Å thick are not currently stable due to their polycrystalline grain structures which typically have mean grain sizes of about 200 nm or more. When foils below about 500 Å thick are formed they suffer from structural deficiencies such as gaps and cracks in the structure of the foil which can contribute to a lack of structural rigidity and therefore sample movement, for example during any thermal expansion caused by electron-beam heating. Furthermore, holes through such films have significantly rough edges caused by the individual grains, which is particularly noticeable at the edges of very small holes. This roughness negatively impacts the ease of imaging and stabilisation. Moreover, thin gold foils with hole sizes of less than 0.5 μm, optimised for single particle cryoEM, cannot be produced by standard diffraction-limited photolithography.

It is desired to provide a support, for use in electron microscopy, particularly cryoEM, which may address some of the problems of known specimen supports, such as unwanted movement during imaging. The present disclosure has been devised in the light of the above considerations.

SUMMARY OF THE DISCLOSURE

The present inventors have found that unwanted movement during transmission electron microscopy imaging using current supports for electron microscopy is caused at least in part by build-up of tensions in the specimen film which can lead to buckling of the film when forces exceed a certain threshold. For example, tensions build-up in vitreous ice films used to immobilise samples for cryoEM, with a buckling threshold that depends directly on the shape of the specimen film. Taking cryoEM as an example, during cryoplunging to freeze the aqueous sample, freezing occurs over a time interval of ≤$10^{-4}$ seconds. Within this time, the water density change is most rapid near the homogeneous nucleation temperature 235K. As the water solidifies, the rapid cooling does not allow sufficient time for structural rearrangements of the water molecules resulting in the accumulation of compressive strain within the thin ice film. If compression exceeds a critical value, the ice film buckles, thus momentarily relieving the radial stress in the layer.

Buckling only occurs if the stress exceeds a critical point, which is determined by the dimensions of the ice film, its elastic moduli, specific volume change relative to the support, and the constraints at the edge of the hole. As the vitreous ice film continues to cool to the temperature of the surrounding cryogen, typically liquid ethane at 90 to 93K, more stress may build up due to further relative density changes. This stress is stored in the film indefinitely once it fully cools down to and rests at 77K (liquid nitrogen temperature).

Even in situations where stress build-up in the ice layer does not exceed the threshold to result in buckling of that layer, when the sample is exposed to the electron beam in a transmission electron microscope (TEM), the localised heating can allow retained stresses to be at least partially relieved resulting in sample movement.

Put simply, the inventors found that buckling threshold of the film depends on the shape and dimensions of the film which is in turn determined by the shape of the hole it is suspended in. The present invention is devised to minimise or avoid the unnecessary build-up of stress in films to reduce, or completely eliminate, sample movement, caused, for example by buckling or relief of stresses on examination. This greatly improves image quality.

In a first aspect there is provided a support for an electron microscopy sample, the support comprising a metallic foil having one or more holes therethrough wherein thickness of the metallic foil is less than 50 nm and/or the mean linear intercept grain size is 50 nm or less, wherein the ratio of the diameter of each hole to the thickness of the metallic foil is 15:1 or less, and wherein the metallic foil consists of either (a) one or more metals selected from transition metals, aluminium and beryllium, or an alloy thereof; or (b) degenerately doped silicon wherein the dopant element is selected from boron, aluminium, boron and arsenic at a concentration of $10^{20}$ atoms/cm$^3$ or higher.

Notably, any alternatives within the first aspect are corresponding technical features of these proposals because they achieve the same technical effect of reducing sample movement to solve the same technical problem of improving imaging.

Transition metals are elements in groups 3 to 11 of the periodic table of elements.

In some cases, some or all of the one or more transition metals are selected from one or more of noble metals (ruthenium, rhodium, palladium, silver, osmium, iridium, platinum, gold), copper, molybdenum, titanium, nickel, chromium, tungsten, hafnium, and tantalum or an alloy thereof. Preferably the one or more transition metals are selected from the noble metals ruthenium, rhodium, palladium, silver, osmium, iridium, platinum, gold or an alloy thereof. Preferably the one or more transition metals are selected from gold, palladium and platinum or an alloy thereof. Preferably the metallic foil comprises or consists of gold or an alloy thereof. Preferably the alloy is a binary alloy. Particularly preferred alloys include gold-silver alloy, gold-copper alloy, nickel-titanium alloy, gold-platinum alloy and platinum-iridium alloy. It may be that the foil does not comprise aluminium. It may be that the foil does not comprise beryllium. It may be that the foil does not comprise an alloy.

For the avoidance of doubt, the metallic foil is not formed from an electrical insulator, a semi-conductor material or a carbon material such as amorphous or graphitic carbon, although these may be present in a metallic alloy as described herein. Semi-conductor materials include materials whose conductivity drops with decreasing temperature in the 300 to 80K range. This includes carbon (amorphous or graphitic but not diamond), silicon (below $10^{20}$/cm$^3$ doping with a dopant element such as boron, aluminium, phosphorus and arsenic), gallium arsenide and other III-V or II-VI binary semiconductors.

In some cases, the ratio of the diameter of each hole to the thickness of the metallic foil is 11:1 or less, 10:1 or less, 8:1 or less, 7:1 or less, or 5:1 or less. The ratio of each hole diameter to the foil thickness may be between 11:1 and 1:1, 10:1 and 2:1, 9:1 and 3:1 or 8:1 and 4:1.

An advantage of using the specified ratios is that it eliminates buckling of specimen films when such films are formed in the holes, such as a suspended amorphous ice film that are used in cryoEM. This allows precise foil tracking during imaging with high-speed detectors, lessening demands on cryostage precision and stability. The present support therefore reduces particle movement to the limit set by pseudo-diffusion, which is less than the resolution of the electron cryomicroscope. This allows reconstruction of a complete map at 1.9 Å resolution with a fluence of <1 $e^-$/Å$^2$ at 300 keV. The specimen films remain stable and under radial compression throughout irradiation, and only diffusive movement occurs which is limited to <1 Å RMS in 30 $e^-$/Å$^2$. The present movement-suppressing microscopy specimen support allows atomic structure determination at only 1 $e^-$/Å$^2$, and extrapolation back to the point before destructive effects of electron radiation affect the reconstruction.

In some cases the metallic foil is substantially free of structural defects. A lack of structural defects means that the foil material is substantially uniform and continuous. That is to say, there are no gaps or cracks visible in the foil and the surface roughness is reduced. For example, the edge roughness of each hole may be 20 nm or less, 15 nm or less, 10 nm or less or 5 nm or less as measured by the root mean square deviation from the expected theoretical hole edge profile. The foil may have only one structural defect that is up to 1 nm in diameter per 100 nm$^2$ area.

An advantage when the thickness of the metallic foil is less than 50 nm and is free from structural defects is that the foil is structurally stable and may be used to generate much higher resolution images by electron microscopy than were previously possible. Moreover, the decreased foil thickness provides thinner specimen films in the holes which have an improved transmission. Known metallic foils having a thickness of less than 50 nm are not suitable for electron microscopy because they provide poor images, often fall apart (i.e. they are not free standing or cannot be suspended across an EM grid square such as a 50 μm grid square, without damage) and cannot adequately suspend sample films.

An advantage when the mean linear intercept grain size being 50 nm or less is a lack of structural defects in combination with a decrease in the roughness of the surface, particular in the edges of the holes, such that the metallic foil may be successfully employed in very high resolution electron microscopy. Foils of these grain sizes are known, but all suffer from structural defects and non-uniformity which makes them unsuitable for electron microscopy, especially at high resolutions. Such known foils are typically formed as a deposit on a supporting surface. By contrast, the present metallic foils are robust enough to be self-supporting when suspended across an opening, for example a 50 μm grid square in a TEM grid. Therefore the foils of the present disclosure are preferably unsupported, i.e. they are not provided on a supporting layer. The specific grain sizes and lack of structural defects of the present metallic foil allow for the formation of rounder and smoother nanoscale holes that provide stable support for suspending a sample.

In some cases, the metallic foil thickness is 49 nm or less, such as 45 nm or less, 40 nm or less, 30 nm or less, 20 nm or less, 10 nm or less or 5 nm or less. The metallic foil thickness is preferably substantially constant throughout. Preferably, the foil thickness may fluctuate by up to only ±25 Å, ±10 Å or ±5 Å throughout.

In some cases, the mean linear intercept grain size of the metallic foil material may be 40 nm or less, such as 30 nm or less, 20 nm or less, 10 nm or less or 5 nm or less. Lower grain sizes provides increasing stability to the foil at lower thicknesses. A mean linear intercept grain size of 10 nm or less is particularly preferred for an optimum balance of the advantages.

In some cases, the diameter of each hole is 750 nm or less, 700 nm or less, such as 600 nm or less, 500 nm or less, 400 nm or less, 350 nm or less, 330 nm or less, 300 nm or less, 250 nm or less, 200 nm or less, 180 nm or less, 150 nm or less, 100 nm or less, or 75 nm or less. In some cases the diameter of each hole is in a range selected from 750 nm to 75 nm, 500 nm to 100 nm, 400 nm to 150 nm, 300 nm to 150 nm, or 250 nm to 150 nm. The holes are preferably substantially circular. The holes may all be substantially the same diameter or different diameters. The diameter of each hole is preferably substantially the same throughout the depth of each hole. Each hole passes completely through the metallic foil. The spacing between the holes is preferably equal. The spacing between the holes is preferably equal to at least one hole diameter. The hole walls are preferably at a 90 degree angle to the surface of the foil, optionally with a precision of ±2 degrees or better. For any hole diameter, the depth of the holes is preferably 500 nm or more. The side walls of the holes are preferably vertical or retrograde (tapered). These two preferences ensure the holes formed in the foil are not likely to be obstructed by material deposited at the bottom/sidewalls of the wells later in the process. The metallic foil may comprise other secondary holes that are greater than the above specified diameter requirement and/or do not meet the above diameter to foil thickness requirement. Because secondary holes do not meet the specified requirements they are superfluous. Alternatively, in some cases, the foil only comprises holes that meet the specified requirements.

In some cases, the metallic foil does not comprise any holes that do not meet the specified nanoscale diameter and/or diameter to thickness ratio requirements.

An advantage of the nanoscale dimensions is that the movement of the particles in the holes is isotropic (the same in the plane of the support and perpendicular to it), spatially uncorrelated, and scales with the root of the incident electron fluence, as would be the case for purely random motion. By comparison, in the larger hole diameters of known supports there is an abrupt, spatially correlated unwanted displacement of the particles at the onset of irradiation (e.g. in the first 4 $e^{-}/Å^{2}$). This is followed by a decreasingly correlated movement that continues with reduced speed to the end of the exposure.

Another advantage is that nanoscale dimensioned holes provide plasmon resonances in the visible range, which causes the support to appear yellow on reflection with white light but blue on transmission, a property which may be useful for characterising a specimen before imaging with electrons.

In some cases, the support has a light wavelength transmittance maximum of from 650 to 800 nm, such as from 700 to 750 nm or 714 nm. The foil support may have a transmittance minimum of from 500 to 600, such as from 625 to 675 or 645 nm.

In some cases, the purity of the metallic foil material is 90% or more, preferably 99% or more; even more preferably 99.999% or more (i.e. contains the stated % of the relevant metallic material).

In some cases, the holes are arranged in a regular pattern on the metallic foil, such as a hexagonal pattern or a square pattern. Preferably, the holes are arranges in a hexagonal pattern. The pattern is preferably regular. The hexagonal pattern provides closer packing and improves structural rigidity. The hexagonal pattern also allows faster examination of multiple holes by automated systems because the closer packing of the holes in the film results in a shorter distance between one hole and the next which speeds up the time for examination of multiple holes.

In some cases, the metallic foil is provided on an EM support grid. The grid provides additional structural support to the foil. In some cases the foil and the grid are of unitary construction. The foil and the grid may be integrally formed. The foil and the grid may have the same elemental composition throughout. The foil and the grid may have different grain structures. The advantages provided by the grid and foil having the same elemental composition include increased stability during imaging because the two structures have the same thermal expansion coefficients, there is minimal, or no, difference in their mechanical behaviour on thermal change (heating or cooling) so little, or no, relative movement between the two structures. Despite having the same elemental composition, the crystal grain structure requirements for the grid material are not as rigorous as for the metallic foil so the foil and grid may have different crystal grain structures, e.g. grain sizes. The grid may be millimetre sized, such circular grids having diameter of 5 mm, 4 mm or, most preferably 3 mm. The grid may comprise one or more support bars arranged to form a mesh across which the foil can be suspended. In some cases, the mesh has a mean hole size that is on a micrometre scale, such as about 300 μm, about 200 μm about 100 μm, or about 50 μm. The mesh holes may be hexagonal or square. Preferably, the mesh holes have a hexagonal shape. Preferably the mesh holes tessellate, i.e. if then holes are square they are arranged in a square array and if they are hexagonal they are arranged in a hexagonal array. The hexagonal holes and array provides closer packing and improves structural rigidity. The mesh hole pattern may correspond to the foil hole pattern.

In some cases, the grid is formed from a material that is selected from the same options listed herein for the metallic foil. In some cases the grid comprises one or more metals selected from transition metals, aluminium and beryllium, or an alloy thereof. It may be that the one or more transition metals are selected from one or more of noble metals (ruthenium, rhodium, palladium, silver, osmium, iridium, platinum, gold), copper, molybdenum, titanium, nickel, chromium, tungsten, hafnium, and tantalum or an alloy thereof. Preferably the one or more transition metals are selected from the noble metals ruthenium, rhodium, palladium, silver, osmium, iridium, platinum, gold or an alloy thereof. Preferably the one or more transition metals are selected from gold, palladium and platinum or an alloy thereof. Preferably the grid comprises or consists of gold or an alloy thereof. Preferably the alloy is a binary alloy. Particularly preferred alloys include gold-silver alloy, gold-copper alloy, nickel-titanium alloy, gold-platinum alloy and platinum-iridium alloy. It may be that the grid does not comprise aluminium. It may be that the grid does not comprise beryllium. It may be that the grid does not comprise an alloy.

In some cases, the grid comprises degenerately doped silicon having a dopant element selected from boron, aluminium, boron and arsenic at a concentration of $10^{20}$ atoms/$cm^3$ or higher.

Hexagonal arrangement of the holes in both the metallic foil and the mesh increases the usable area tenfold over a standard cryoEM grid, allows more than 800 images to be acquired from a single stage position and provides more than 5000 individual holes in a single 25 μm wide hexagonal mesh hole, for example.

In some cases, the electron microscopy is transmission electron microscopy, preferably transmission electron cryo-microscopy.

The grid or mesh that may be present as a support for the metallic film may, in some cases be arranged within a support rim. The options for the material used for the support rim are the same as those for the grid described above. Preferably the support rim is integral with the grid structure.

In a second aspect there is provided the use of the support of the first aspect in electron microscopy, optionally in transmission electron microscopy, preferably in transmission electron cryo-microscopy.

In a third aspect there is provided a method of manufacturing a metallic foil for a support according to the first aspect comprising the steps of depositing a metallic layer onto a patterned substrate that is cooled to 200K or less to form a layer having a thickness of 50 nm or less and having one or more holes therethrough; removing the deposited metallic layer; and forming the metallic layer into a support for an electron microscopy sample, wherein the metallic foil consists of either (a) one or more metals selected from transition metals, aluminium and beryllium, or an alloy thereof; or (b) degenerately doped silicon wherein the dopant element is selected from boron, aluminium, boron and arsenic at a concentration of $10^{20}$ atoms/$cm^3$ or higher.

By cooling the substrate in the deposition step it is possible to generate a metallic layer thereon that not only has a reduced grain size compared to deposition at room temperature but also have an excellent uniformity and continuity that is previously unknown at such grain sizes, particularly for gold and other suitably described metals and materials. This is achieved because the lower temperatures reduce the thermal energy of the atoms faster than if the surface was uncooled so reducing motion of the metal atoms on the deposition surface once they are deposited on the substrate. The atoms are rapidly immobilised upon depositing upon the substrate so the atoms move less and agglomerate into smaller grains than if the surface was uncooled.

In some cases the deposited foil is a metallic foil as described herein.

Furthermore, for many small EM samples, the desired foil hole size is a lower diameter than the diffraction limit of known photolithography techniques currently used to make specimen supports, and evaporated metal, in particular gold, foils below about 400 Å thick are not stable (e.g. cannot be lifted from a deposition substrate without significant damage) due to their polycrystalline grain structure. The present method affords metallic foils that do not suffer from these deficiencies.

In some cases, the patterned substrate is a silicon wafer, optionally between 3 mm and 300 mm in diameter, such as 100 mm. The silicon wafer may be a degenerately doped silicon wafer with a resistivity <0.02 Ohm·cm. Alternatively, a silicon wafer with higher resistivity of 1 to 30 Ohm·cm can be used. The silicon wafer may be formed by Talbot displacement (phase interference) lithography as described in Jefimovs 2017. The template-substrate distance during the phase interference lithography may be used to control the diameter of the holes in the silicon surface. A regular templating array can set the spacing between the holes to be patterned in the substrate. The silicon substrate is patterned so as to form recesses therein to correspond to the holes in the desired metallic foil.

In some cases the metallic foil may be formed integrally with a supporting arrangement, e.g. a mesh, of grid bars. In such a case, if it is desired to set the foil a certain distance below the level of the top surface of the grid bars, a mask with the grid bar pattern is applied to the photoresist coated silicon template to only expose the grid bar regions after developing. These are then etched, for example by reactive-ion etching (RIE), to make trenches at the desired depth. This step may be necessary to make the grids compatible with current specimen plunging and blotting apparatuses. If it is desired for the surface of the foil to be level with the top surface of the grid bars, this step is not required.

In some cases, there is a step of Bosch etching of the holes in the substrate. This controls their final depth and ensures the hole walls are at a 90 degree angle compared to the surface of the substrate with a precision of 2 degrees or better.

In some cases, there is a step of cleaning the patterned substrate before deposition of the metallic layer. The cleaning may be by immersion, for example in Piranha solution ($3H_2SO_4$:$1H_2O_2$, freshly mixed), oxygen plasma or UV-Ozone plasma. Cleaning is advantageous to remove contaminants that can lead to poor hole formation.

In some cases, the metallic layer is deposited onto the patterned substrate wherein the substrate is at a temperature of 150K or less, 125K or less, 100K or less or 90K or less. The temperature of the substrate may be set from 84K to 92K. Preferably, to reduce the grain size of the metallic foil and allow for the formation of rounder, smoother holes therethrough, the substrate stage is kept at 77K (liquid nitrogen temperature) during the evaporation. Higher deposition rates require cooling to lower temperatures. The deposition may be by electron beam or thermal evaporation. For instance, the temperature range for nucleating 10 nm or smaller crystals at 1 Å/s deposition rates is 200K or less, assuming surface adatom diffusion with activation energy of 0.5 eV. The substrate having the deposited metallic layer may be slowly (about 50K/hour or slower) warmed up to room temperature in vacuum to prevent the foil from delaminating.

Preferably, for the best growth of the metallic crystals, the optimal deposition temperature is lower, due to the high-self diffusion coefficient of metallic materials, such as gold. The purity of material to be deposited is preferably 90% or more in order to form a stable continuous layer, more preferably 99% or more; even more preferably 99.999% or more.

In some cases, the patterned substrate is provided with a first sacrificial layer applied to the patterned substrate onto which the metallic layer is deposited. Any layer which is selectively etchable with respect to the relevant metallic foil layer can be used for this layer. The sacrificial layer may be a metal, such as copper (which is particularly preferred for gold foils). It is preferred that the sacrificial layer is copper. The sacrificial layer may also be deposited on the substrate under the cooling conditions described above. The deposition conditions are preferably the same for the sacrificial layer as the metallic foil layer. This is preferred because unwanted imperfections and roughness of the deposited sacrificial layer may otherwise be imparted to the side of the metallic foil layer formed thereon. The thickness of the sacrificial layer is preferably at least the same as the specified grain size. For example a sacrificial layer having a thickness of at least 10 nm, or at least 25 nm, or at least 50 nm may be used. The maximal thickness of the sacrificial layer is preferably less than the radius of the holes in the foil.

In some cases there are one or more steps to transfer the metallic foil onto an EM grid. The foil may be transferred onto commercial EM grids using a float process. Alternatively, the grids may be directly fabricated on the substrate carrying the foil to afford an integrated foil and grid. The latter is option is preferable for production on a large scale. The formation of the foil integrally with at least a mesh of grid bars and preferably the entire grid (mesh of grid bars and thicker grid circumference rim) is preferable because the use of the same metal for both foil and grid bars eliminates differences in thermal expansion coefficients and therefore substrate movement on heating (e.g. beam heating on exposure to an electron beam).

In some cases, the support is according to the first aspect.

Support Production by Transfer of the Metallic Foil to a Commercial Grid

To transfer the metallic foil to a commercial grid there may be steps of lifting off, cleaning and lowering the foil onto the grid. The foil may be coated with a 1 to 10 μm layer of negative photoresist before being lifted. The lifting step may include etching of a sacrificial layer, such as copper, to release the foil from the substrate. The cleaning step may be performed by one or more HCl washes (e.g. of 20%, 2%, 0.2% HCl, followed by at least three water rinses). The lowering step may include lowering a foil onto a clean grid by arranging the grid on the bottom of a dish filled with water in which the foil is floating and slowly syphoning the water out. If a supporting resist layer was used, it can then be removed by washing each individual grid in the appropriate solvents, and treating with low-energy plasma.

Optionally, polymer-assisted graphene transfer, as described in Naydenova 2019, can be carried out after the foil is lowered onto the girds.

Support Production by Integral Formation of the Grid on the Metallic Foil

To produce a support having an integrated metallic foil and grid, a photoresist is temporarily applied and the excess foil between adjacent prospective individual foils is etched away. A second temporary photoresist is applied so that grid bars, along with any optional additional features such as alignment marks, fiducials, labels, unique identifiers, can be deposited by electroplating. The photoresists are applied, exposed under a mask, developed and removed using standard techniques. After removing the second photoresist the surface is cleaned with an oxidative plasma or UV-Ozone. A supporting plastic layer is spun across the grids. The supports, now each comprising an integrated foil and a grid and supported together on the same plastic layer, are then lifted off the substrate and cleaned, e.g. by a series of 20 to 0.2% aqueous hydrochloric acid and water washes.

The step of electrodeposition may form a deposited metallic layer totalling 10 to 15 μm in thickness for the grid bars and rims. The metallic layer may be deposited from an electrolyte solution, preferably a non-cyanide bath, for example sulfite/thiosulfite. Such a solution typically has 10 to 15 g/L concentration of a metallic material to be deposited and is used at 50 to 60° C. with an applied current density of 2 to 10 mA/cm$^2$. Both of these parameters are varied to control the residual stress in the electroplated metallic layer. Under these conditions, for example, electroplated gold has Young's modulus of at least 35 GPa and hardness of at least 40 Vickers.

The step of lifting off may include etching a sacrificial layer, such as copper by chemical wet etching, typically in ferric chloride or ammonium persulfate-based etchants. The lifting off preferably occurs in 20 minutes or less at room temperature, so as to prevent the non-selective etching of the metallic foil layer by the copper etchant. If the etching is carried out at higher temperature, the time is approximately halved for every 10 degrees of heating. The grids may be released from a silicon template by etching the silicon, preferably in a hot (80° C.), agitated solution of KOH (30%). The lift off occurs almost instantly on immersion into the solution and is accompanied by removal of the photoresist by the same solution. The individual grids released by this process may then be transferred in a clean bath of KOH, followed by two deionized water baths, a clean bath of piranha solution at room temperature (to remove any copper), and two more deionized water baths.

After the washing step, the integral supports are sufficiently stable on the plastic layer for packaging and shipping. The plastic layer can be removed by dissolving in an appropriate solvent immediately prior to use of each integral support. Any remaining small traces of the plastic can be removed by subsequent low-energy plasma treatment of the cleaned grids. The grids may be lowered onto a suitable support, e.g. filter paper, and dried ready for use.

The requirements for a suitable plastic layer are therefore (i) to be easily removable with solvents, (ii) to be insoluble in water, HCl, copper etchant (either ammonium persulfate or ferric chloride) and (iii) to have sufficient flexibility and structural rigidity for the lifting off the substrate and transferring to wash baths. Examples of suitable plastics include positive or negative photoresists, polystyrene and collodion.

Optionally, polymer-assisted graphene transfer, as described in Naydenova 2019, can be carried out immediately after the deposition of the metallic foils to yield a graphene layer positioned between the foil and the grid bars. This is preferable in small scale procedures. Alternatively, it can be carried out after the grids are fully formed but still attached to the wafer. In this latter case, the plastic layer assisting the graphene transfer might also be used as the plastic layer, or an extra plastic layer may be added as described above. If a large scale procedure is used (e.g. wafer scale), the graphene can preferably be transferred onto the grids after their release from the wafer. This can be achieved, for example, by transferring the grids from the wafer onto another temporary supporting structure, for example a suitable polymer that can later be dissolved in organic solvents.

It has been determined that excellent support quality can be assured if one or more of the following parameters are met; (a) the fraction of clogged/malformed holes is <1%

(caused by suboptimal cleanliness of the substrate prior to evaporation); (b) the deviation from roundness of the holes is <10 nm (caused by insufficiently small grain size due to elevated temperature and/or deposition rate during evaporation, or by partial etching of the foil during the lift off); (c) the hole edge flatness is <10 nm (as above, also caused by wear of the template); (d) the grid bar defect areas is <1% (caused by defects in the masks); (e) the adhesion of the foil to the grid bars is sufficient to withstand stresses due to rapid cooling to from 277K to 80K (106 K/s or faster) and (f) the foil coverage is >99%.

These proposals also include an EM support as formed by a method described herein.

In a fourth aspect there is provided a method of electron microscopy imaging comprising a step of sequentially imaging a sample suspended in a hole of a support according to the first aspect, wherein each image encompass at least a part of the edge of the hole and the electron beam encompasses the hole and the complete edge of the hole.

In some cases, at least a part of the edge of the hole in each image is compared to the other images to remove any relative shift between sequential images and/or wherein the sequential images of the specimen in the hole are weighted to account for damage to the specimen.

SUMMARY OF THE FIGURES

So that the invention may be understood, and so that further aspects and features thereof may be appreciated, embodiments illustrating the principles of the invention will now be discussed in further detail with reference to the accompanying figures, in which:

FIG. 1A shows typical drift-corrected electron micrograph used for tracking gold particles in vitreous water on all-gold supports; scale bar is 0.5 μm. The inset (20 nm×20 nm) shows an overlay of the initial and final positions of a gold nanoparticle at the beginning of irradiation and after a fluence of 60e$^-$/Å$^2$.

FIGS. 1B and 1C show the root mean of the squared displacements of 200 to 2000 particles from 10 to 50 movies of different diameter holes (UltrAuFoil R2/2-1.9 μm, UltrAuFoil R1.2/1.3-1.2 μm, UltrAuFoil R 0.6/1-0.8 μm, and custom made grids with 0.3 μm, and 0.2 μm holes) are plotted as a function of cumulative electron fluence for 0° (B) and 30° tilt (C). Error bars show standard error in the mean. All exposures were under the same illumination condition (300 kV, 2.4 μm beam diameter, 8 e$^-$/Å$^2$/s). The ice thickness in all imaged holes was 300±50 Å.

FIG. 1D shows that thin films of ice used in cryoEM buckle during vitrification if the compressive stress (N) exceeds a critical value ($N_0$) determined by the aspect ratio (2a/h) of the film. Electron irradiation causes the film to move in response to additional stresses in it, as evident from the correlated particle movement at the beginning of irradiation.

FIGS. 3A and 3B show optical micrographs, in (A) reflected and (B) transmitted unpolarized white illumination of the patterned gold foil (hexagonal array of 200 nm diameter holes with 600 nm pitch) on a 600-mesh thin-bar gold grid. The scale and the corresponding area is the same for (A) and (B). The foil is blue in colour in transmitted light is due to a strong red absorption enhancement by the periodic hole pattern.

FIG. 3C shows a transmission electron micrograph of a single grid square on one of these grids. A 3 mm grid contains about 800 of these hexagons, each of which includes more than 5,000 holes in a regular pattern. The circle encloses more than 800 holes, which can all be imaged at high magnification without moving the stage during high-speed data collection.

FIG. 3D shows a transmission electron micrograph of the holey gold foil. The arrows show the pitch of the regular hexagonal pattern.

FIG. 3E shows a transmission electron micrograph of a single hole in the nanocrystalline foil. The roundness of the 200 nm hole has been improved by reducing the gold grain size to 10 nm.

FIG. 3F shows a low-dose transmission electron micrograph of the protein DPS (220 kDa) vitrified on a grid of the present invention with 260 nm holes.

FIG. 4A shows plot of the mean squared particle displacement during irradiation (positive slope) for the ensemble of all DPS particles used in the reconstruction, and plot of the relative B-factor for each frame with respect to the first (negative slope) with a linear fit to the B-factor decay which agrees with the expected slope from radiation damage alone. The mean squared displacement of the particles is linear with the fluence, in agreement with purely diffusional movement corresponding to an effective diffusion constant of 0.02 Å$^2$/(e$^-$/Å$^2$).

FIG. 4B shows selected side chains (His51, Glu82, Asp156) and a water molecule from per-frame DPS reconstructions show the progression of radiation damage. The residues from the refined model are shaded by atom, and the contoured density map is shown as a mesh.

FIG. 4C shows the real (triangles) and imaginary (squares) parts of selected Fourier pixels at 2.2, 3.1, 4.5, and 7 Å resolution, plotted as a function of total fluence. The structure factors can be extrapolated to their values before the onset of irradiation, corresponding to the undamaged structure (filled symbols at 0 fluence).

FIG. 7A to 7J show the root mean squared movement of gold nanoparticles embedded in a suspended ice film in different hole diameters as a function of cumulative fluence, at angles of 0° or 30° tilt. Stage drift has been subtracted from these displacements. Error bars show standard error in the mean. The dots show the displacements of individual particles (200 to 2,000 particles per plot). All exposures were under the same illumination condition (300 kV, 2.4 μm beam diameter, 8 $e^{-}/Å^{2}/s$). The ice thickness in all imaged holes is 300±50 nm.

FIG. 12A shows one full HexAuFoil grid that has a diameter of 3 mm and is separated from the neighbouring grids on the wafer. The darkest areas correspond to the exposed silicon surface of the templating wafer. Arrow 1 points to one of the four fiducial markers on the grid, which label each of the four quadrants. The grid also has two rim marks, which are visible by eye. The largest quadrant mark (arrow 2) is clear of foil, and this location can be conveniently used to perform electron microscope alignments and flux measurement. Arrow 3 points to the thin gold foil connection strips between the grids which provide continuous electrical contact for electroplating. The dashed boxes indicate the magnified areas in FIGS. 12B, 12C, and 12D (from top to bottom).

FIG. 12B shows that each grid contains a center mark. The writing appears mirrored by design; when the grid is separated from the wafer and viewed from the flat foil side, it will be flipped to the correct orientation.

FIG. 12C shows that each hexagon is 50 micrometres wide, and contains 8000-9000 holes. In designs with alternative pitches, this size hexagon might have 3000-5000 holes. For smaller hexagons, the number of holes per hexagon is reduced in proportion to the open area. The grid bars are formed of electroplated gold, and are 10 micrometres wide and 10 micrometres thick in this example. The preferred thickness is from 5 to 20 micrometers. The aspect ratio of the bar (thickness/width) is preferably in the range from 0.25 to 4, and in most cases 0.5 to 2, with this example equal to 1.

FIG. 12D shows that each grid has a clear rim mark, which is also visible by eye (requiring dimensions of at least 0.2 mm). The radial direction from the center of the grid toward the rim mark is indicated with a line going across the middle of the hexagons. This line is visible in the electron microscope, and can be used, along with the other alignment features, to map the orientation of the grid in the microscope, relative to its orientation during specimen preparation, for example.

FIGS. 13A and 13B show scanning electron micrographs of two HexAuFoil gold foils, still attached to the templating silicon holey wafer via the sacrificial copper underlayer. Both micrographs are acquired at 0° tilt, with 30 kV acceleration voltage using an Everhart-Thornley detector. The scale is set by the center-to-center hole spacing, which is 600 nm for both. The foils in FIGS. 13A and 13B differ only by the templating hole diameter, which is 300 nm for FIG. 13A and 200 nm for FIG. 13B, respectively. Discs of gold foil can be seen at the bottom of each hole in the silicon wafer, with a shadowing angle dependent on the viewing angle from the gold source during electron beam evaporation of the foil towards the given point on the wafer. If the holes are insufficiently deep, these discs can remain attached to the foil and obstruct the holes when the foil is released from the wafer. A depth of 500 nm is sufficient to avoid this for 200-300 nm holes and 300 Å thick copper and gold foils.

FIG. 14A shows a scanning electron micrograph (45° tilt, with 2 kV acceleration voltage using an Everhart-Thornley detector) of the bar side of the grid after release from the wafer and removal of the copper adhesion layer. The grid is clipped in a standard clip-ring/clip holder used for transmission electron microscopy.

FIG. 14B shows a scanning electron micrograph (45° tilt, with 30 kV acceleration voltage using an Everhart-Thornley detector) of one of the hexagons on the same grid, acquired from the flat foil side of the grid, i.e. after the grid is flipped over relative to its orientation in FIG. 14A. This is the side of the grid that was originally covered with the sacrificial copper layer, making contact to the silicon template. The holey foil spans each grid hexagon and remains intact.

FIG. 14C shows a scanning electron micrograph (45° tilt, with 30 kV acceleration voltage using an Everhart-Thornley detector) of the holey gold foil demonstrates the edge flatness of each hole and surface flatness of the foil. These characteristics help with the formation of a thin, flat ice layer when the grids are used for cryoEM sample preparation.

FIG. 14D shows a transmission electron micrograph of the suspended gold foil on the grid after release from the wafer, which can be used as a sample support for transmission electron microscopy. The spacing between the holes is 600 nm. The dashed box delineates the area magnified in FIG. 14E.

FIG. 14E shows a transmission electron micrograph of one hole in the gold foil of the free-standing HexAuFoil grid. The hole diameter is 300 nm as indicated. The edge roughness is limited by the grain size of the gold foil, in this case approximately 20 nm for gold deposited at 85-90 Kelvin substrate temperature. Dashed black circle is exactly round, for comparison with the edge of the hole.

FIG. 14F shows in-plane movement statistics of gold nanoparticles in the HexAuFoil grids produced by the wafer-scale method (right) indicate the performance of these grids in terms of reducing specimen movement is equivalent to that of the HexAuFoil grids produced by the small scale method in the previous publication (Naydenova, Jia & Russo 2020) (left).

DETAILED DESCRIPTION

Figure 1:
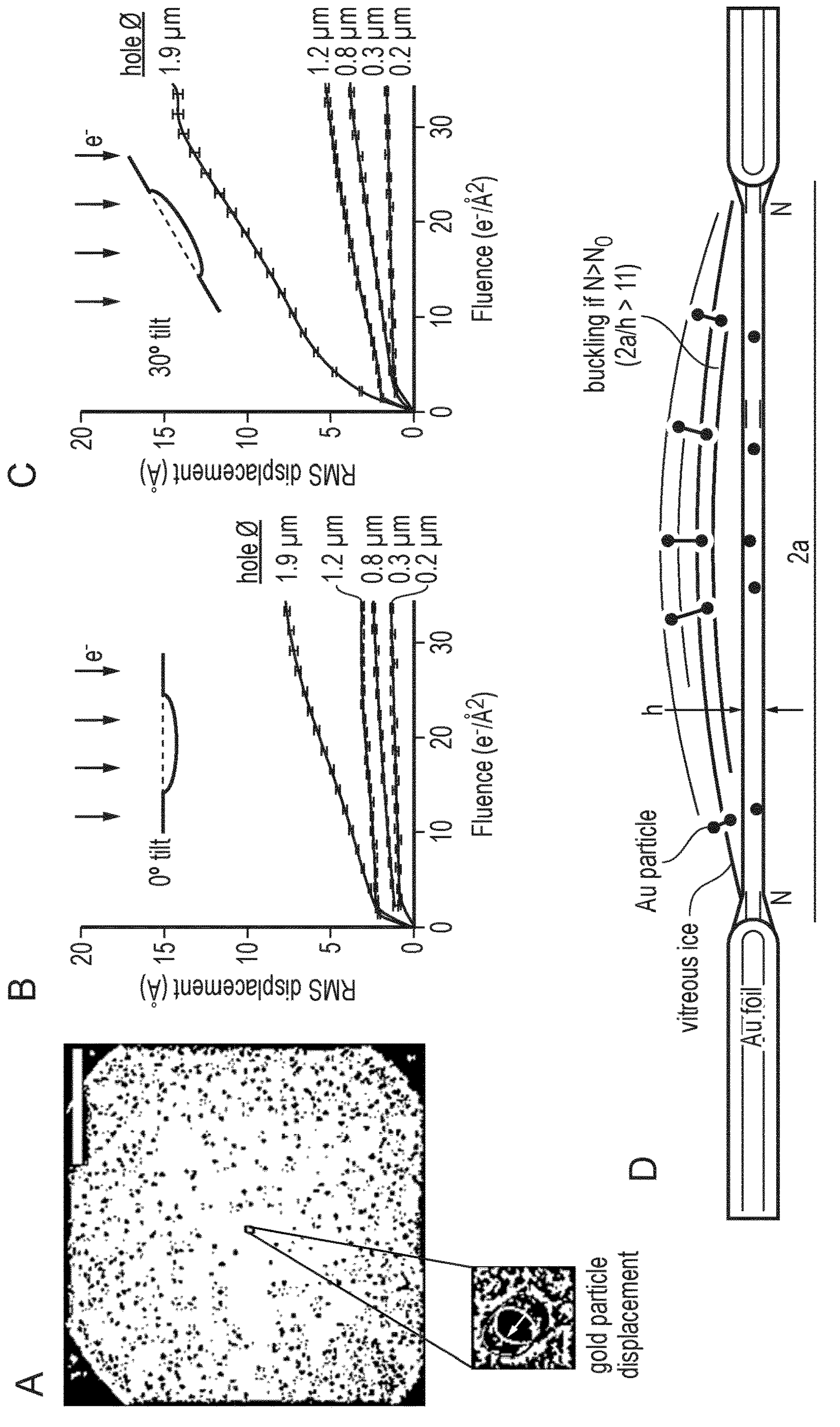
FIG. 1 shows movement of gold nanoparticles in vitreous ice in a range of foil hole sizes.
Figure 2:
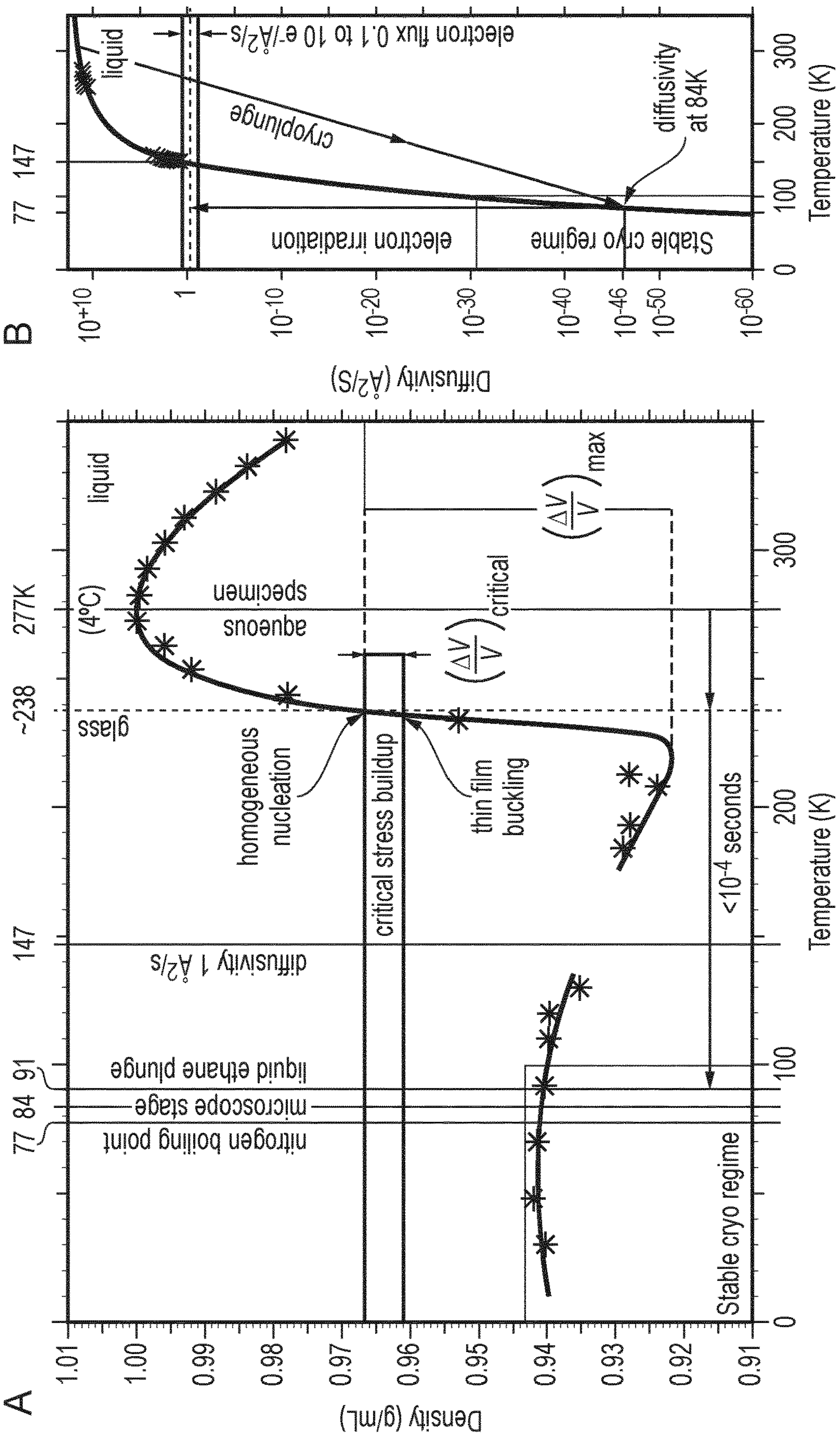
FIG. 2A shows a model of the stress accumulation in thin films of amorphous ice during cryoplunging and their response to electron irradiation. The density of liquid and amorphous water is plotted (stars) as a function of temperature, with a solid line to guide the eye. During cryoplunging into liquid ethane, water is rapidly cooled from, typically from 277K to 91K (arrow at bottom). The largest specific volume change experienced by water below its homogeneous nucleation point is $(\Delta V/V)_{max}\approx5.5\%$. The thin film can only withstand compression of up to $(\Delta V/V)_{crit}$ before it buckles (critical stress buildup range corresponds to a 300 Å thick layer in a 1 μm hole).
FIG. 2B shows the diffusivity of water molecules in liquid and amorphous ice is plotted (crosses) as a function of temperature. The solid line is a fit to these values. The extrapolated diffusivity in amorphous ice at 84K is vanishingly low, ~$10^{-46}$ Å$^2$/s. The shaded region in the bottom left indicates the range of diffusivity in amorphous ice at temperatures in the 0-100K range, where it is stable indefinitely. During imaging with 300 keV electrons, water molecules move pseudo-diffusively by 1 Å$^2$/(e$^-$/Å$^2$). At typical imaging fluxes of 0.1-10 e$^-$/Å$^2$/s, this is equivalent to 0.1 to 10 Å$^2$/s (shaded band between the top and middle) and corresponds to an instantaneous local temperature of 147K.
Figure 3:
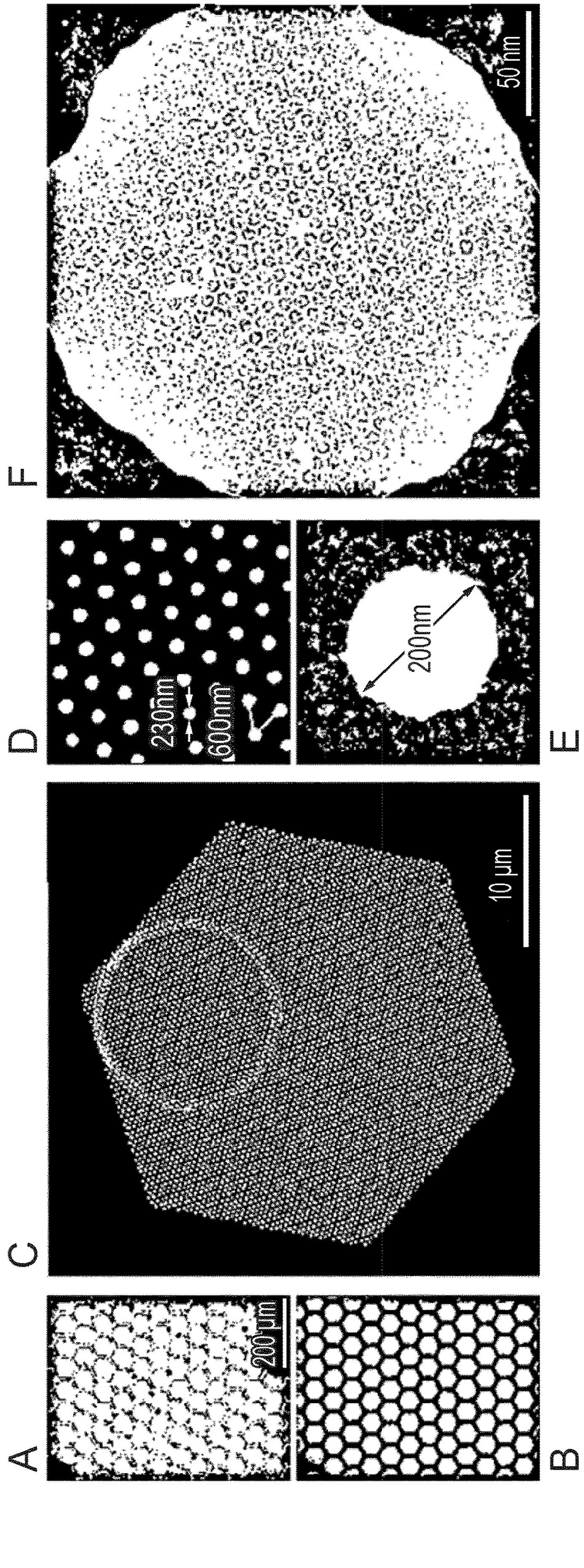
FIG. 3 shows a foil that is an all-gold specimen support designed for movement-free cryoEM imaging.
Figure 4:
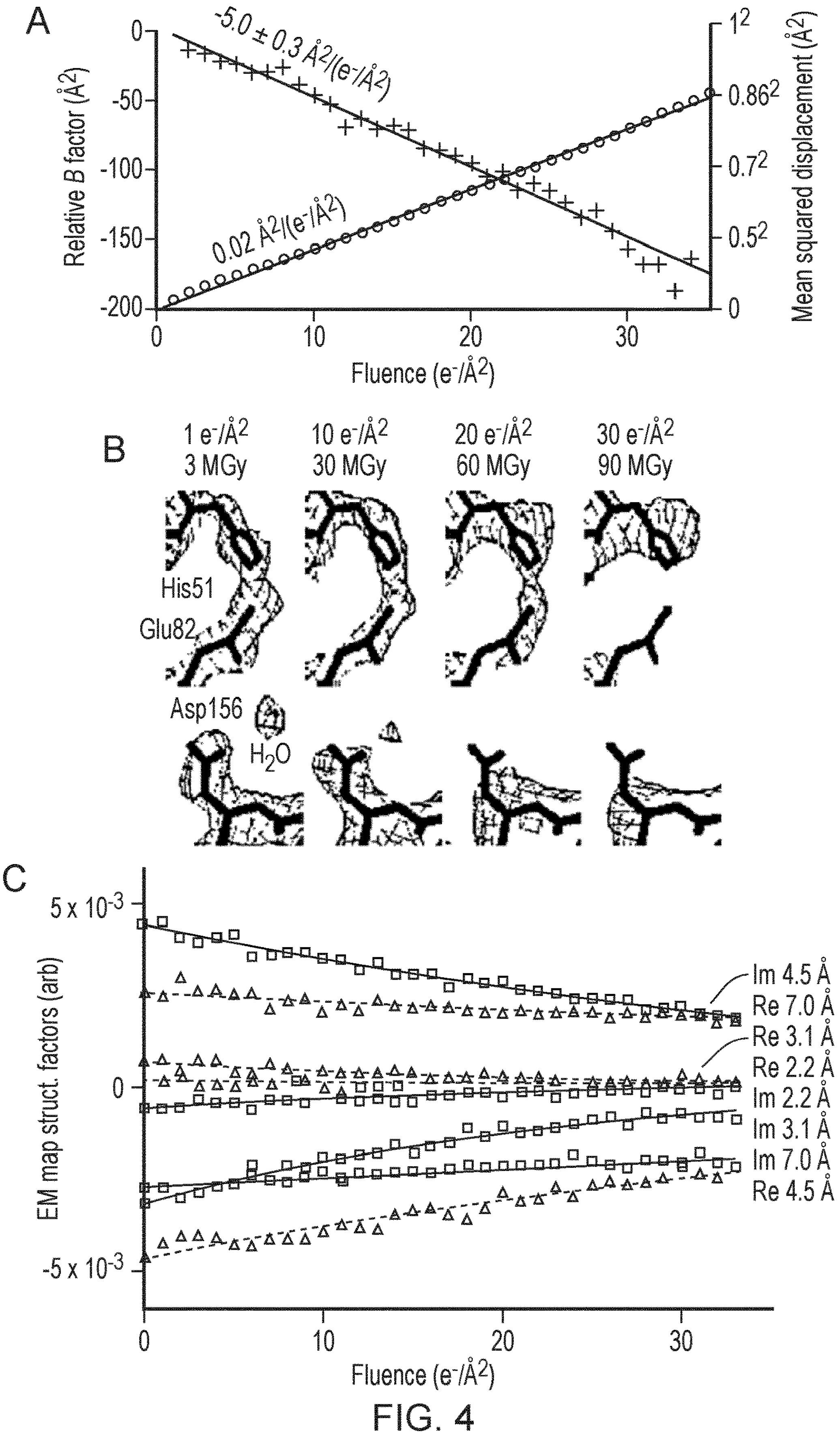
FIG. 4 shows the structure of DPS determined at <2 Å resolution and 1 e$^-$/Å$^2$ fluence using a 260 nm hole support.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

For the avoidance of any doubt, any theoretical explanations provided herein are provided for the purposes of improving the understanding of a reader. The inventors are not bound by any of these theoretical explanations.

Any section headings used herein are for organizational purposes only and are not to be construed as limiting the subject matter described.

Throughout this specification, including the claims which follow, unless the context requires otherwise, the words "have", "comprise", and "include", and variations such as "having", "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means, for example, +/−10%.

The words "preferred" and "preferably" are used herein refer to embodiments of the invention that may provide certain benefits under some circumstances. It is to be appreciated, however, that other embodiments may also be preferred under the same or different circumstances. The recitation of one or more preferred embodiments therefore does not mean or imply that other embodiments are not useful, and is not intended to exclude other embodiments from the scope of the disclosure, or from the scope of the claims.

As used herein, the term "metallic" is used to refer to a material or component (such as a foil) displaying properties of a metal. In particular they display high electrical and thermal conductivity. In many cases electrical conductivity in metallic materials is higher than $10^4$ S/m.

Electron Microscopy Support

A support for electron microscopy is an apparatus which allows the carriage of the sample to be examined by electron microscopy into and out of the electron microscope. A degree of mechanical strength is provided to the support by a peripheral wall or rim inside which is typically arranged a mesh of members (such as grid bars). The sample to be examined is mounted onto the support within an area defined by the periphery of the grid bars. In cryoEM, the sample itself is suspended in a film (such as in a vitreous ice film) which is suspended in the holes or pores of a foil that is suspended between the grid bars. Foils are also commonly referred to as supporting films.

The foil part of the support typically has a mesh or "holey film" structure. These foils are typically described in the art with two numbers, for example "2/1"—this means a foil with two micrometre pores at a one micrometre spacing. Similarly, a foil designated 2/4 would have holes or pores of two micrometres, at a spacing of four micrometres, and so on. The term "support" includes instances where the foil is provided with and without a grid.

Example 1—High Resolution cryoEM Structural Determination of DNA Protection During Starvation Protein (DPS)

To demonstrate the use of movement-free specimen supports for high-resolution cryoEM the structure of the 220 kDa DNA protection during starvation protein (DPS) was determined. DPS was plunge frozen on grids with 280 Å thick gold foil with 260 nm holes. The average resolution from an initial reconstruction from about 9 hours of automated data collection on a modern 300 keV microscope, easily reached <2 Å and the total particle displacement was 0.86 Å RMS in 35 $e^-/Å^2$ of irradiation. The absence of buckling also ensured no significant rotation of the particles during imaging. In contrast to all previous single particle cryoEM datasets to date, maps reconstructed from each frame show that the first frame (1 $e^{-}/Å^{2}$ or 3 MGy) contained the most structural information and the quality (B-factor) of sequential frames decays linearly with dose/fluence. A linear decay in B-factor with dose is expected from studies of radiation damage in X-ray and electron crystallography, but has never previously been observed for single particle cryoEM due to movement at the onset of irradiation.

Example 2—Gold Foil Characterisation

The mean linear intercept grain size of some gold foils fabricated as described herein were measured by TEM and found to be 100±10 Å. This is approximately 20 times smaller than the grain size in gold foils fabricated under similar conditions but at room temperature. The small grain size allows for both thinner foils and smoother hole edges. The typical edge roughness of 200 to 300 nm holes (deviation from a circular shape) is less than 10 nm.

Comparative Examples—Previous Foils are Unfit for Purpose

The following examples illustrate the improvements of the present electron microscopy supports by detailing and comparing the defects in currently known supports.

Defect type 1: Malformed holes due to increased grain size due to increased evaporation rate The gold film shown in FIG. 11A was evaporated at a rate of 6 Å/s onto the patterned substrate held at about 90K. The sacrificial copper layer (not shown) was evaporated at 27 Å/s. These evaporation rates resulted in malformed holes due to the increased grain size. The hole diameters vary between 50 and 250 nm. Compare with the foil in FIG. 11D, which was produced by evaporation onto the same template at the same temperature, but at a lower rate (1 Å/s for both copper and gold), and has the same thickness. In that foil, the typical hole deviation from roundness is 10 nm or less.

Figure 10:
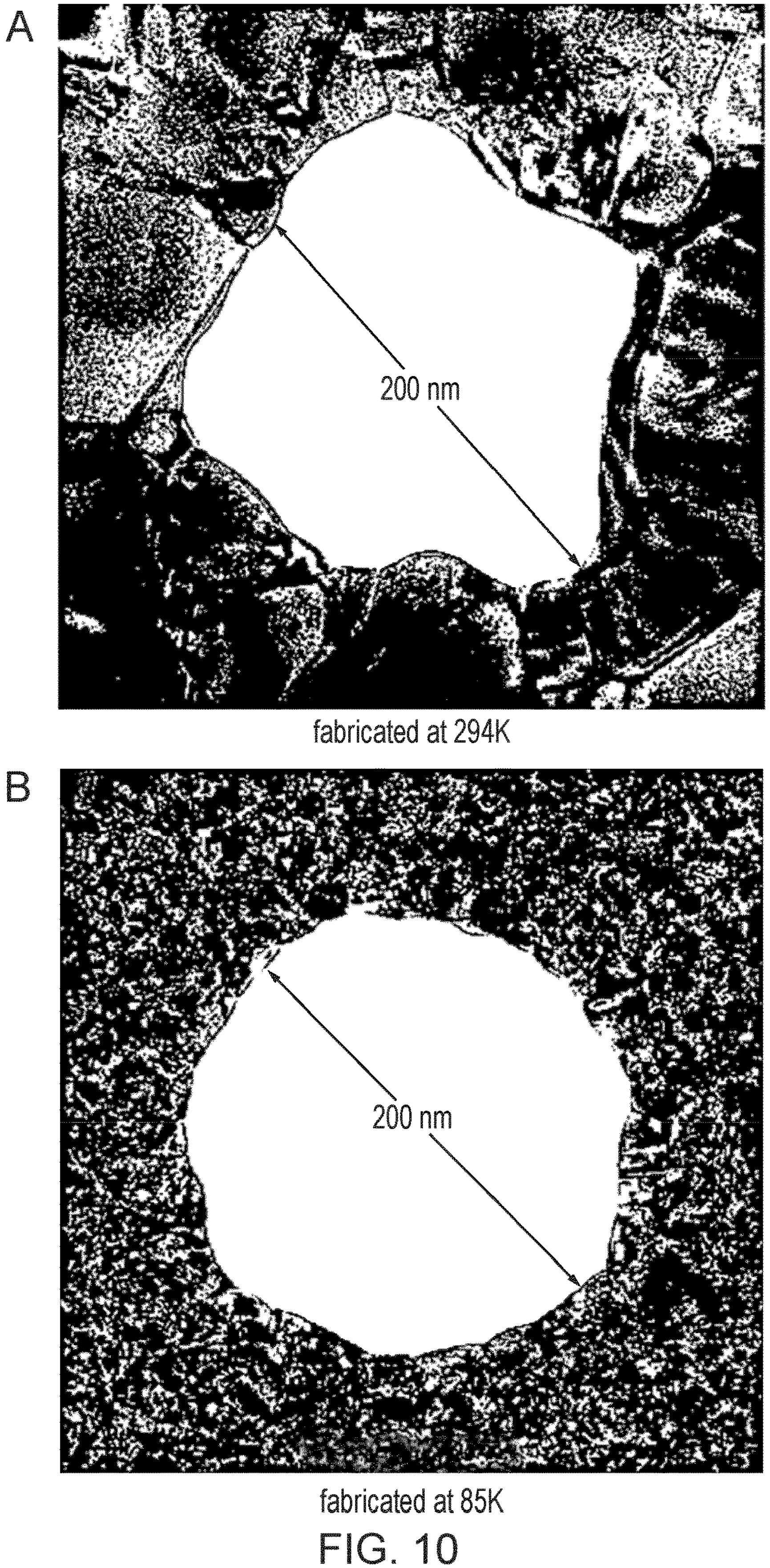
FIG. 10 shows controlling the shape of sub-micrometer (nanometer) holes in a nanocrystalline gold foil. Transmission electron micrographs of typical holes in a gold foil produced by evaporation onto a silicon template (210 nm holes) at ambient temperature (A) and at 85K, achieved by liquid nitrogen cooling of the substrate (B). The gold was evaporated at the same rate (1 Å/s) in both cases. Reducing the temperature reduces the gold grain size by a factor the order of 10× by reducing the surface diffusivity of the deposited gold. This allows for the formation of more regular and rounder holes.

Defect type 2: Malformed holes due to increased grain size due to increased evaporation temperature are shown in FIG. 10A.

Defect type 3: Malformed holes due to over-etching

Figure 11:
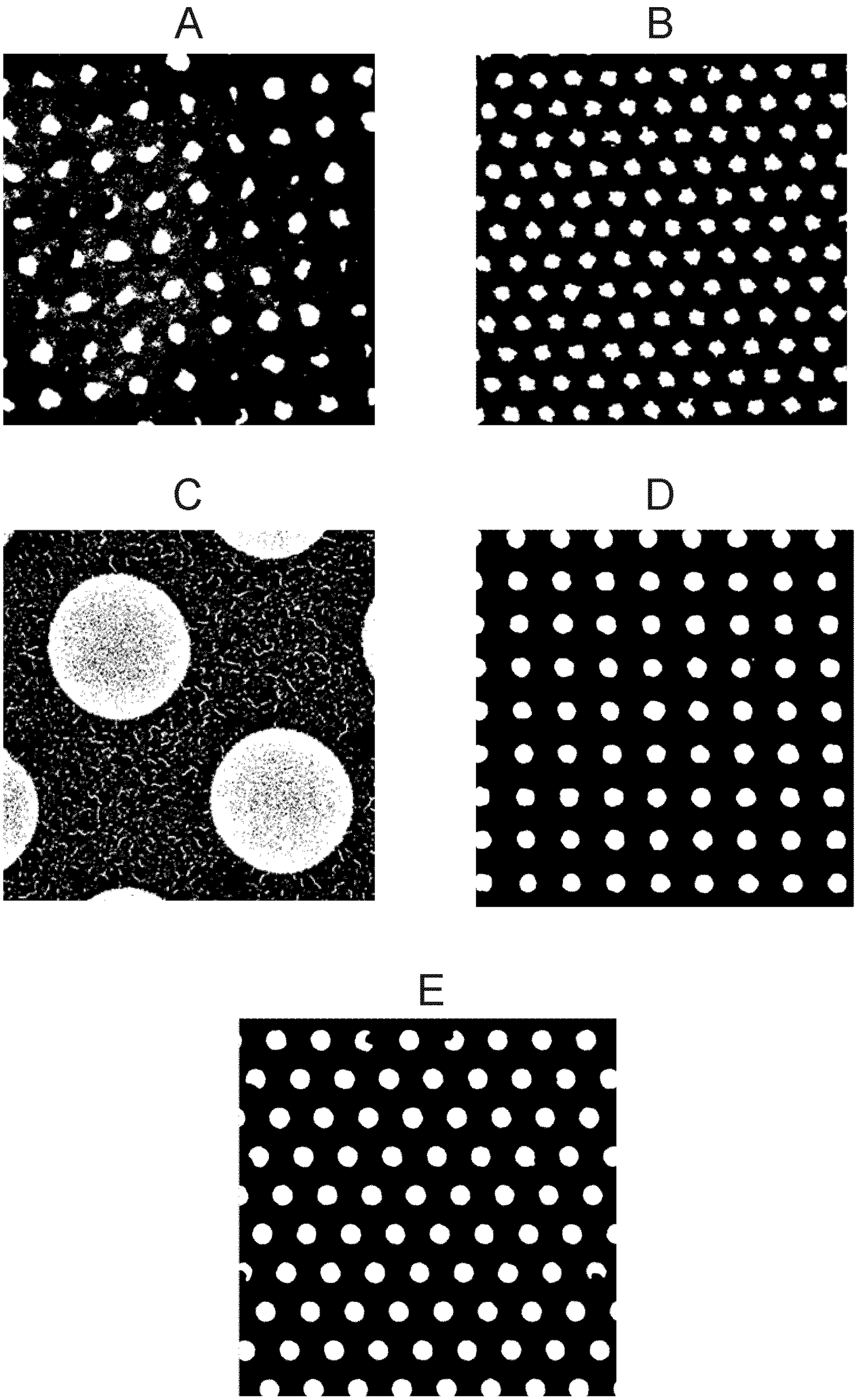
FIGS. 11A to 11E illustrate the improvements of the present electron microscopy supports by detailing and comparing the defects in currently known supports.
Figure 12:
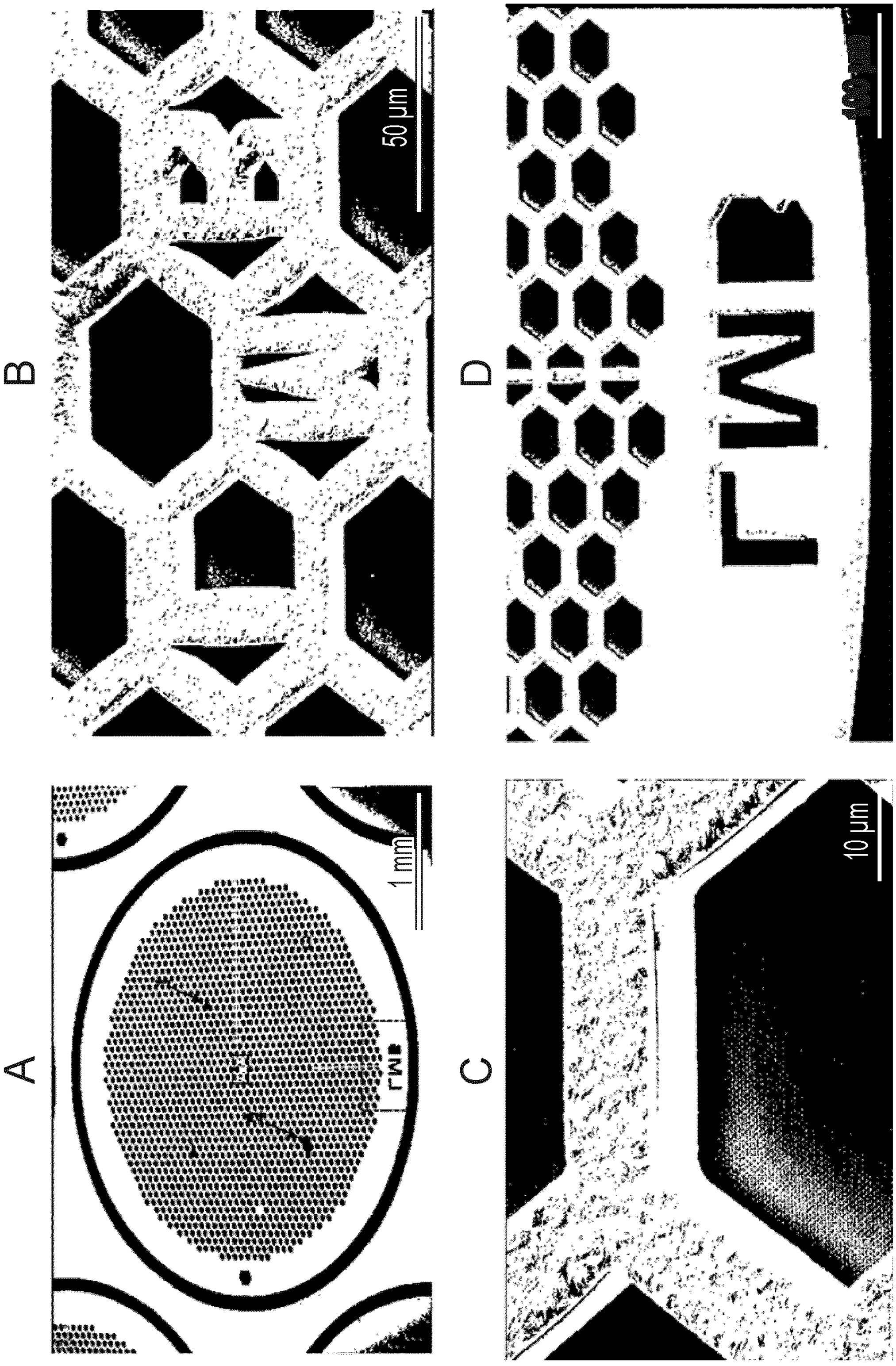
FIG. 12 shows scanning electron micrographs of a HexAuFoil grid, fully fabricated on a holey wafer, and still attached to the wafer. All micrographs are acquired at 30° tilt, with 30 kV acceleration voltage using an Everhart-Thornley detector.
Figure 13:
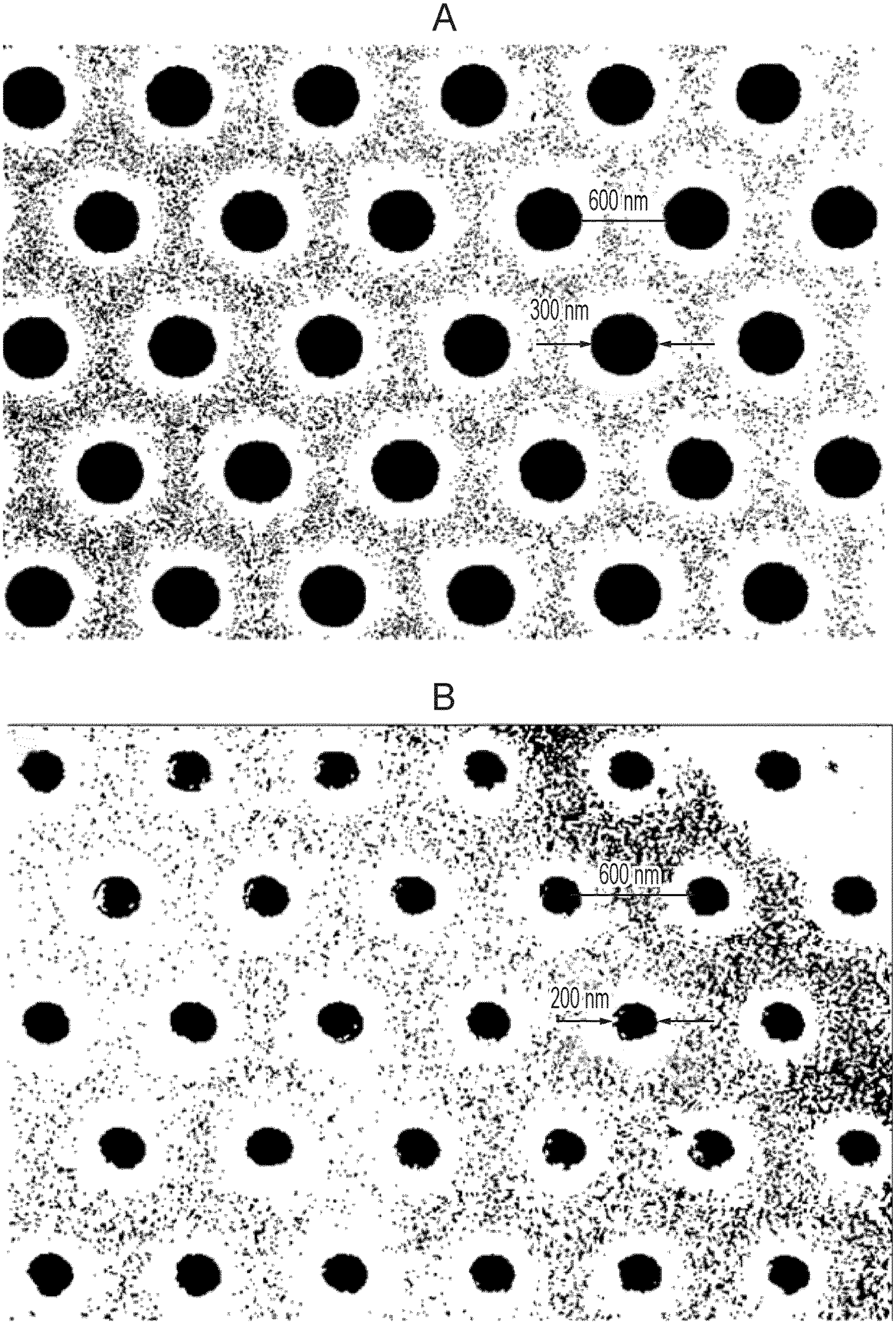
FIG. 13 shows HexAuFoil grids with 200-300 nm hole diameters.
Figure 14:
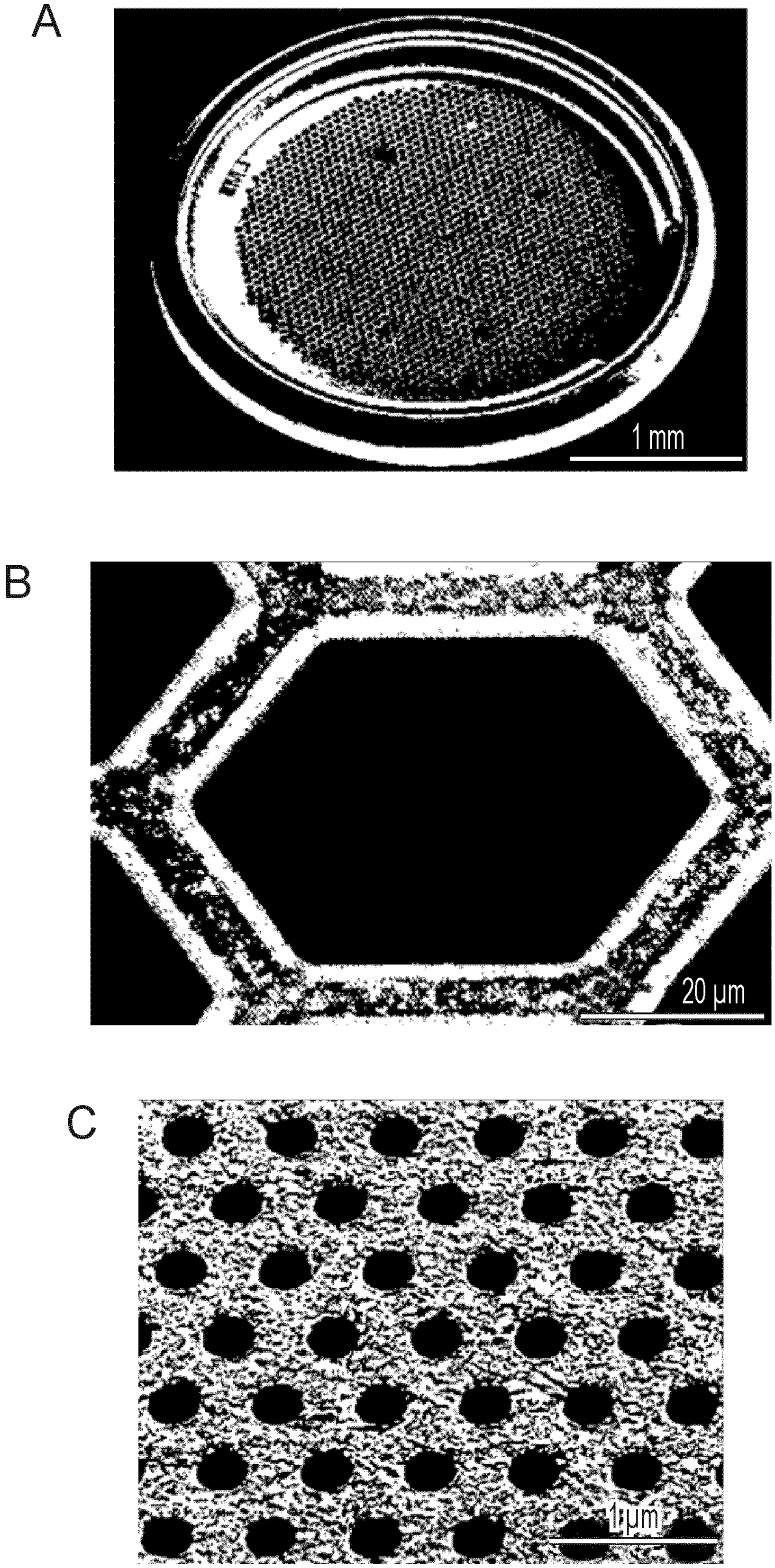
FIG. 14 shows HexAuFoil grids released from the wafer post-fabrication.
Figure 14:
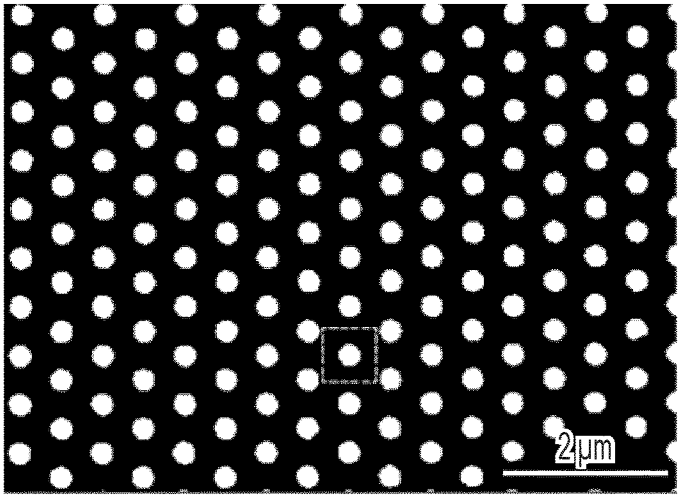
Figure 14:
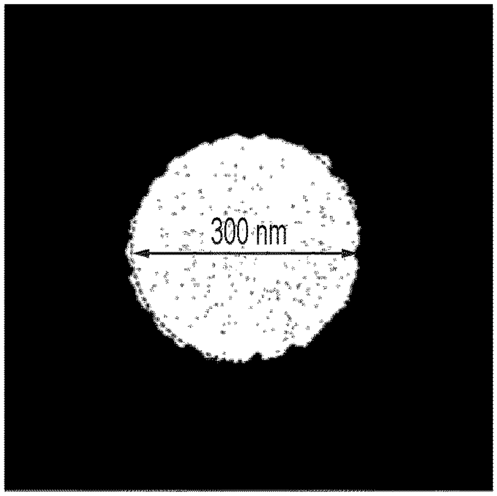
Figure 14:
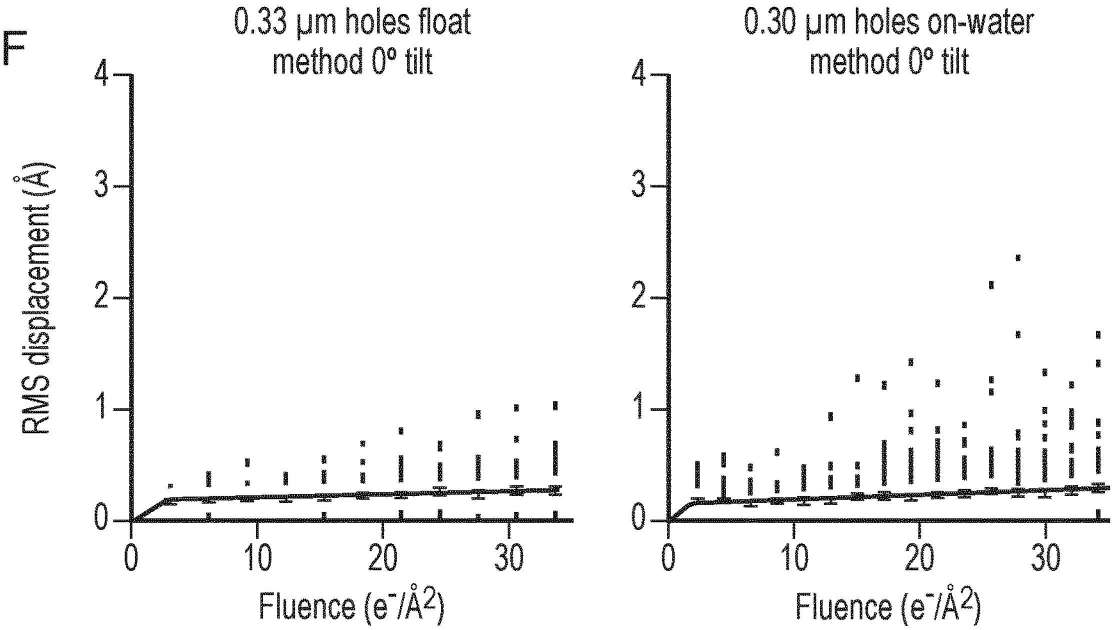

The gold foil shown in FIG. 11B was evaporated in a way identical to the one from FIG. 11E, onto the same substrate. The release (etching of the sacrificial Cu layer in ferric chloride) was 2 times slower for this film than for the one in FIG. 11E (30 min vs 15 min). This resulted in irregular enlargement of the holes (by about 50 nm) due to etching of the gold by the ferric chloride. The distance between holes (pitch) is 600 nm.

Defect Type 4: Porosity

The gold foil shown in FIG. 11C was manufactured by the method in Russo 2014 where the gold evaporation is at room temperature. The foil thickness is 326 Å, and the holes are 2 μm in diameter. This is thicker than the present foils. Due to the larger grain size of about 200 nm the foil remains porous at this thickness and is unstable. This was demonstrated using in the paper Russo 2014 which shows that even a 397 Å thick foil becomes unstable due to this porosity and discontinuous metal foil. The typical pore dimensions are 200 nm long×10 nm wide and 30 to 40/$\mu m^2$.

Figure 5:
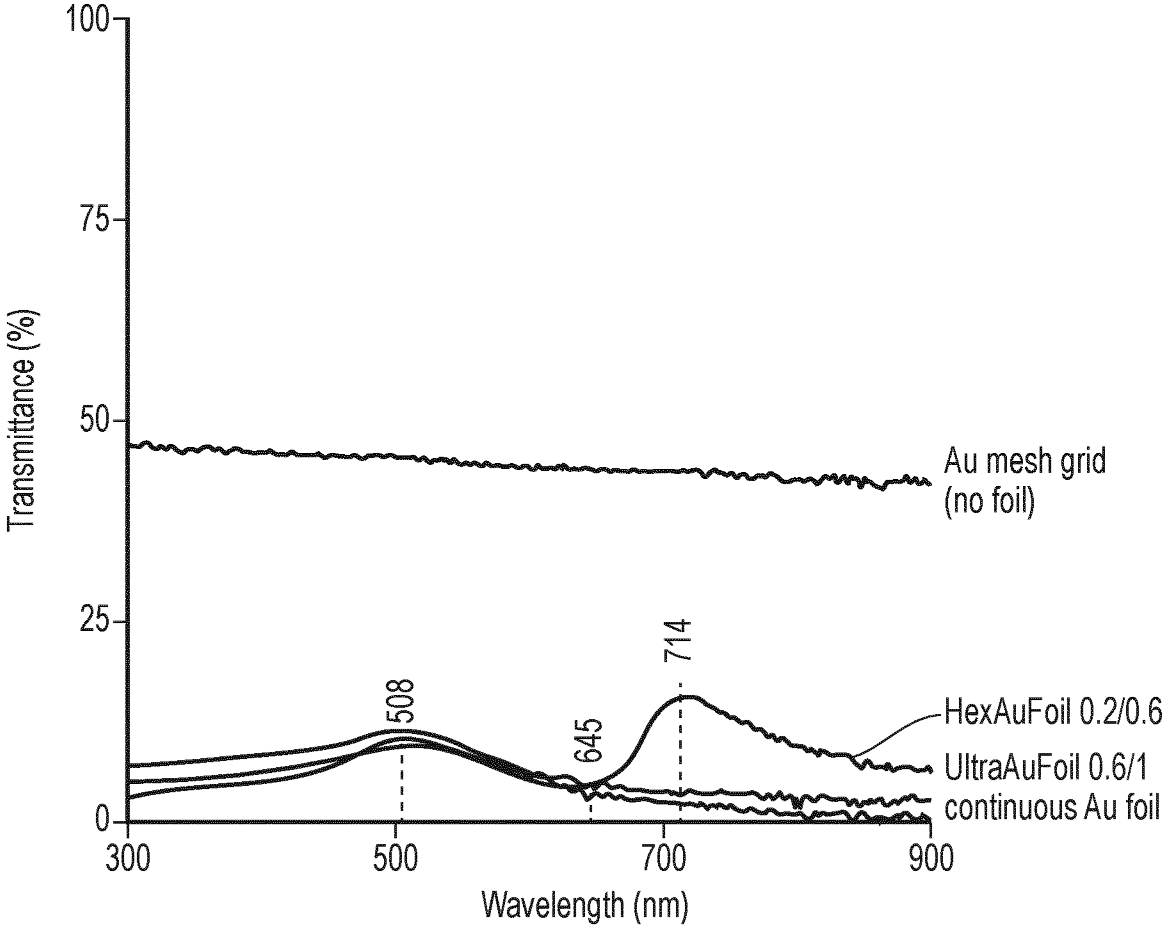
FIG. 5 shows the optical transmission spectra of a support of the present invention, a continuous gold foil, a commercial UltrAuFoil, and a bare grid for comparison. The peak at 508 nm is characteristic of all thin gold films. Only the present support, due to its holes with a diameter comparable to the wavelength of light, produces a characteristic minimum at around 645 nm and a maximum at 714 nm. These are due to a resonance corresponding to a localized surface plasmon at the hole circumference.
Figure 6:
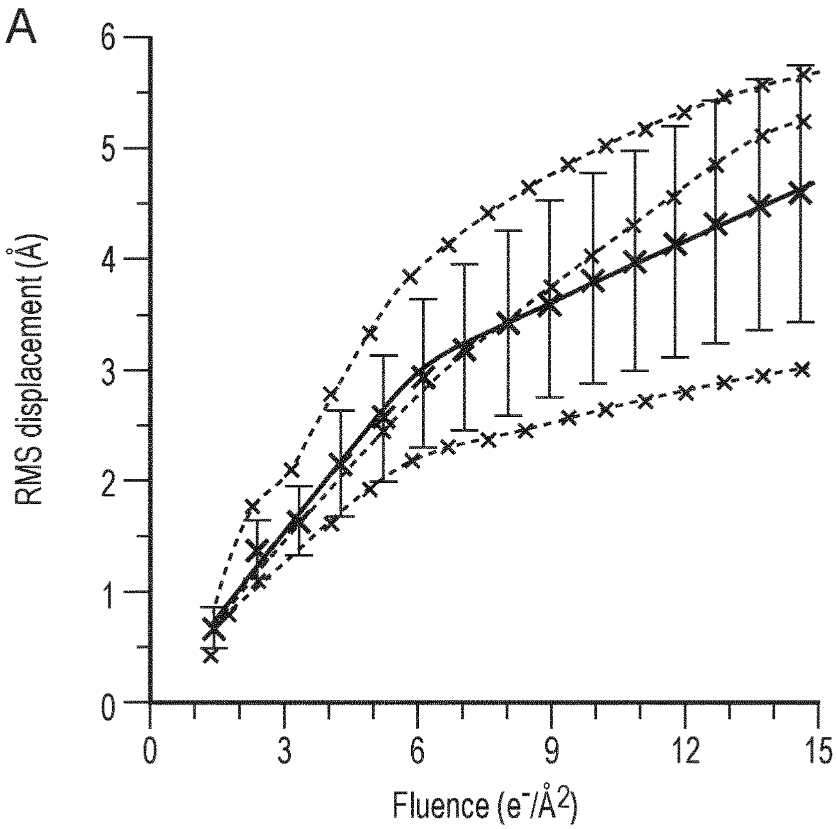
FIG. 6 shows how a microscopy support of the present invention practically achieves the theoretical pseudo-diffusion limit in comparison to five known specimen support designs. Specimen supports of amorphous carbon on amorphous carbon in FIG. 6A, suspended ice in FIG. 6B, graphene on carbon in FIG. 6C, gold in FIG. 6D and graphene on gold in FIG. 6E all show an RMS displacement value of ribosomes with Mw 2 MDa that is greater than the specimen support of the present invention shown in FIG. 6F which demonstrates an RMS displacement value virtually identical to that of the theoretical pseudo-diffusion limit shown in FIG. 6G.
Figure 6:
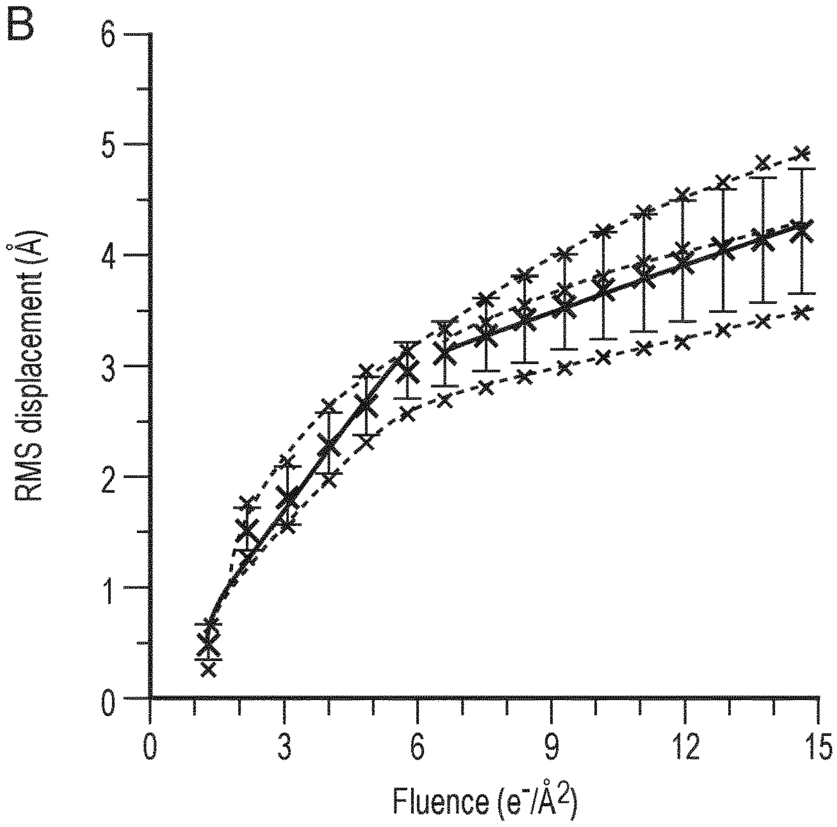
Figure 6:
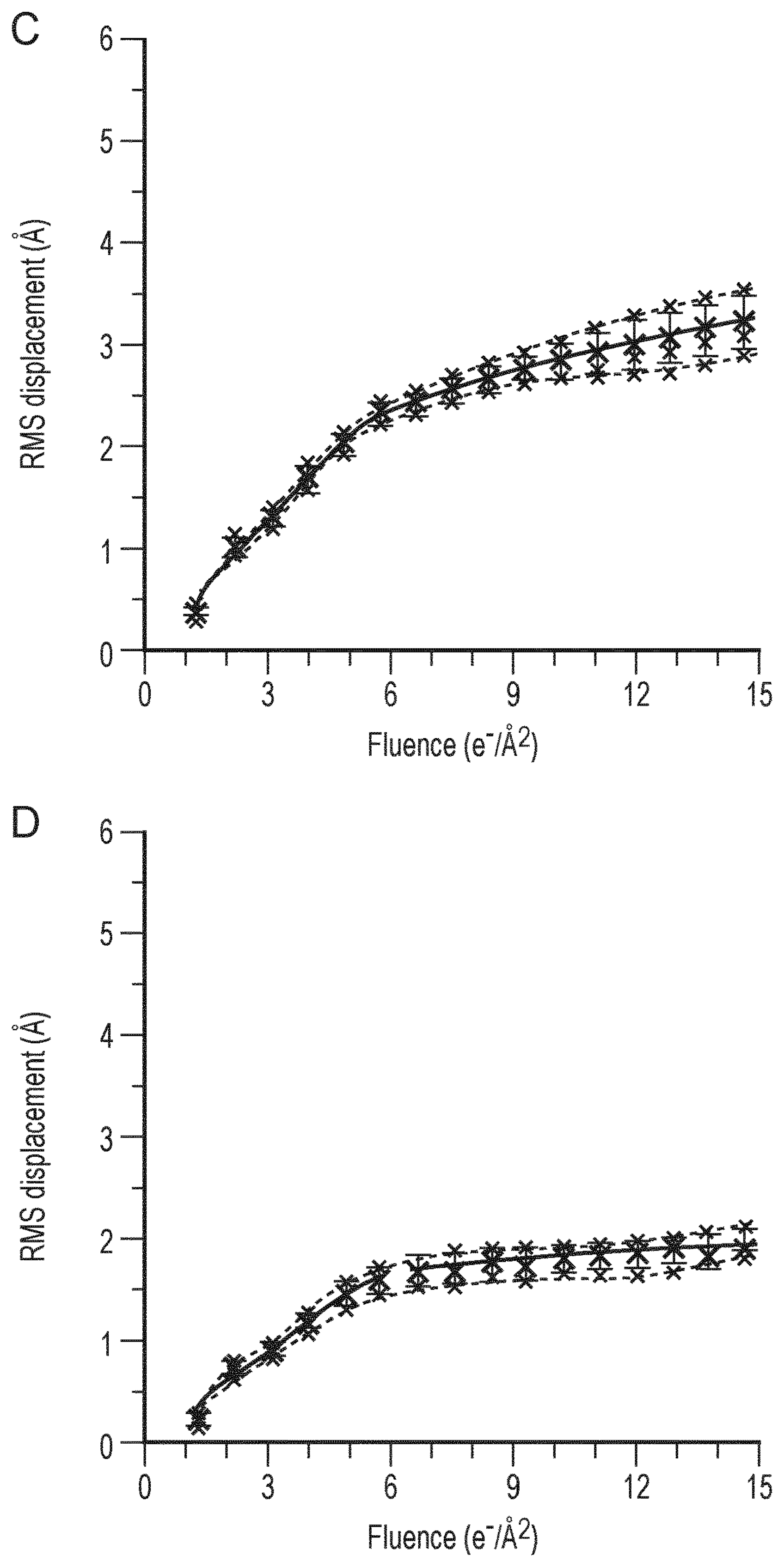
Figure 6:
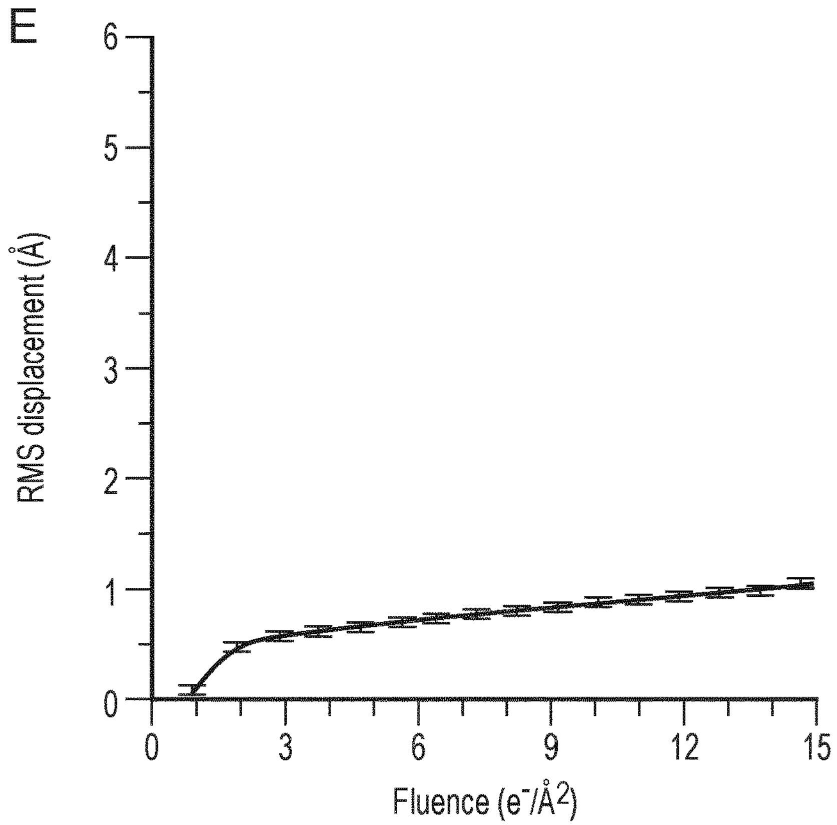
Figure 6:
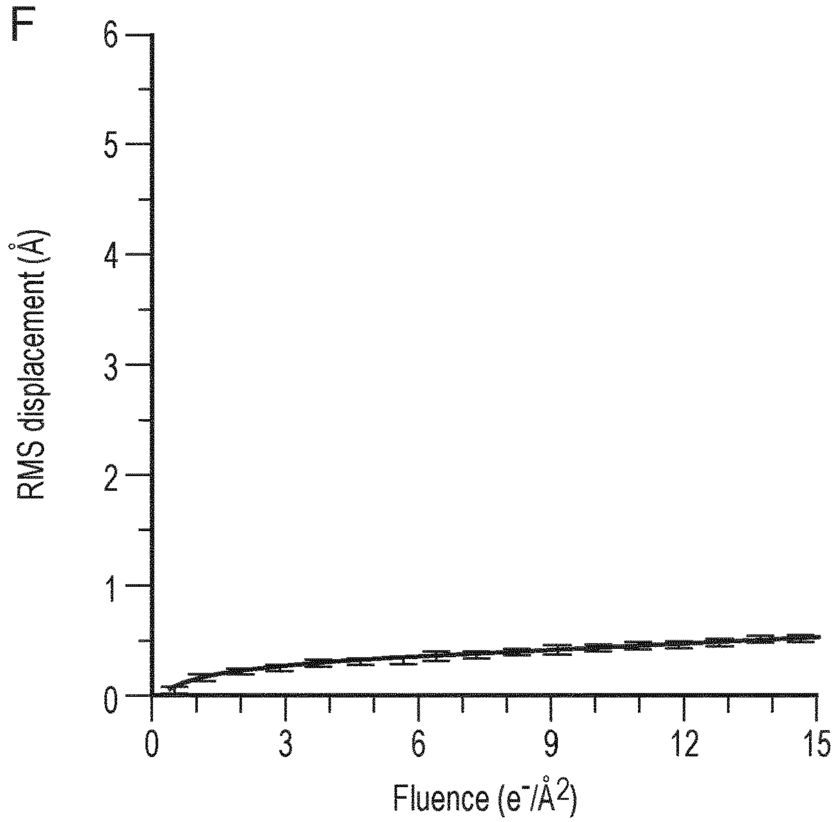
Figure 6:
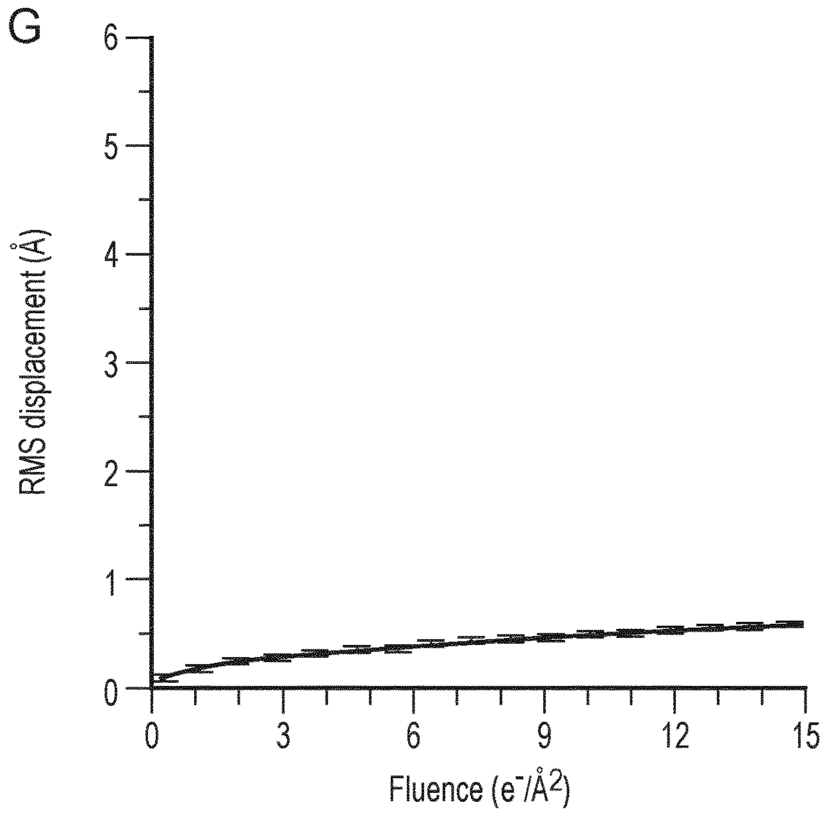
Figure 7:
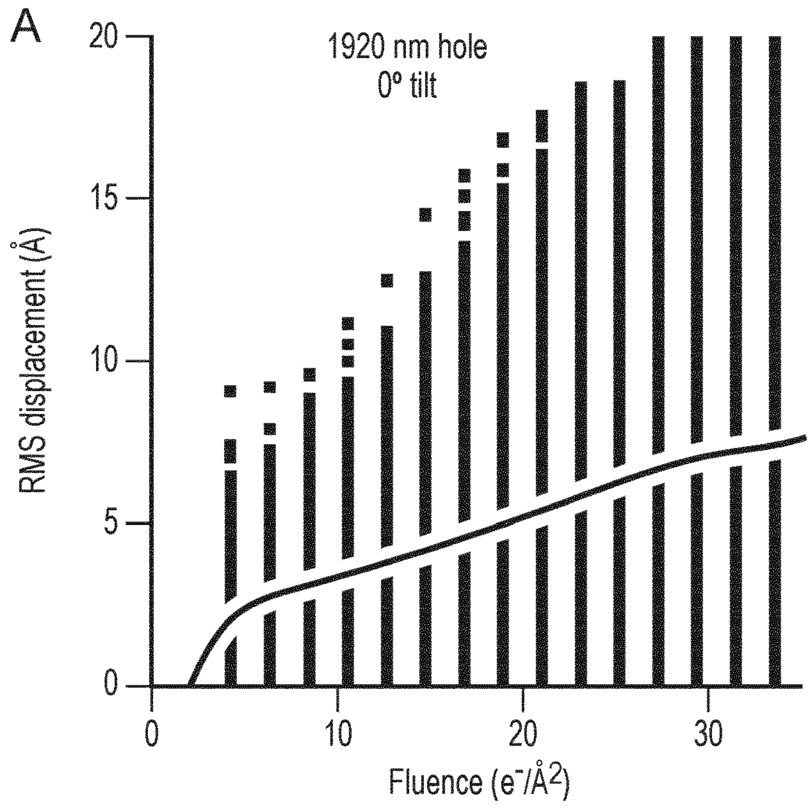
FIG. 7 shows root mean squared displacements of all tracked particles.
Figure 7:
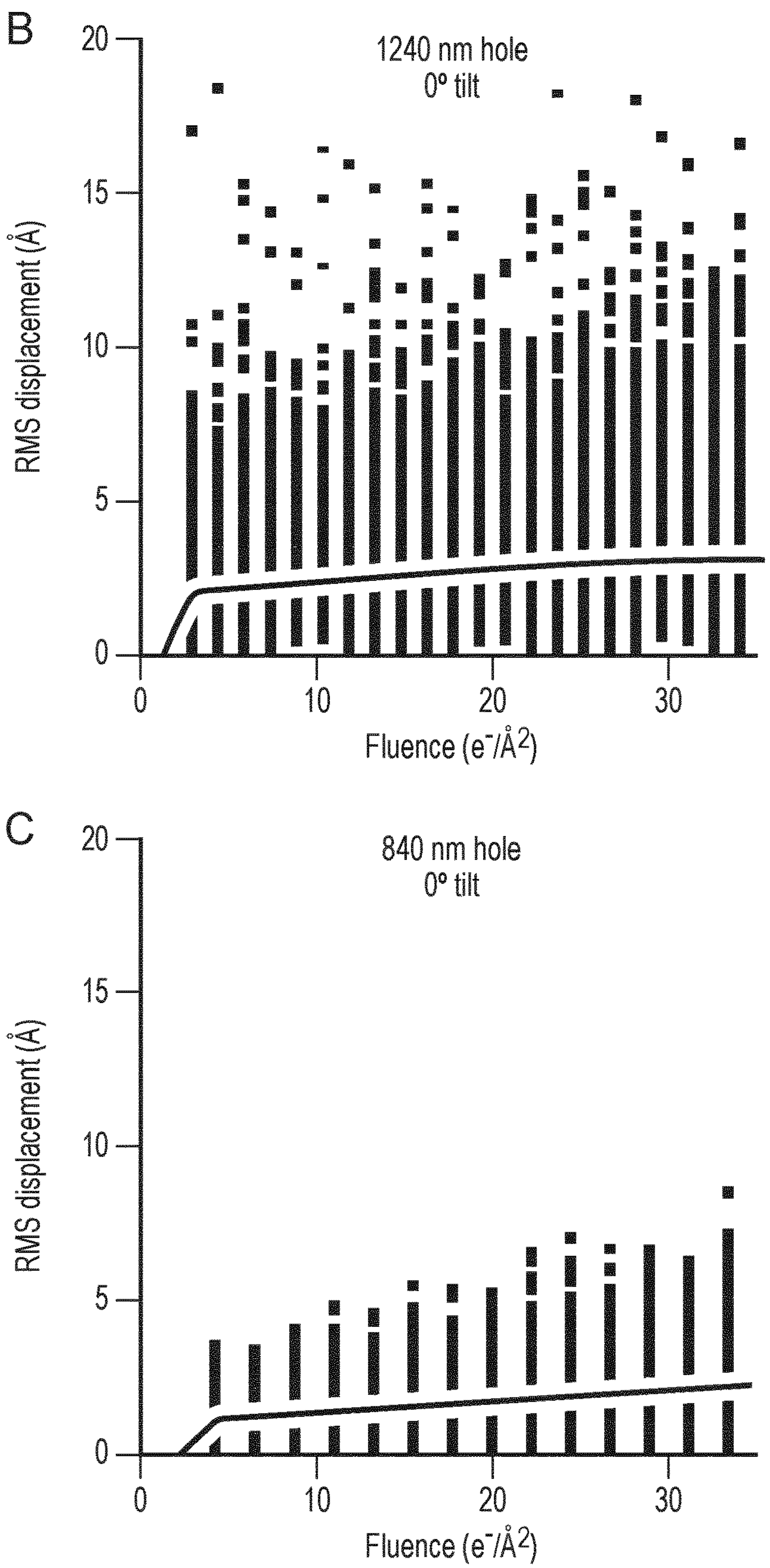
Figure 7:
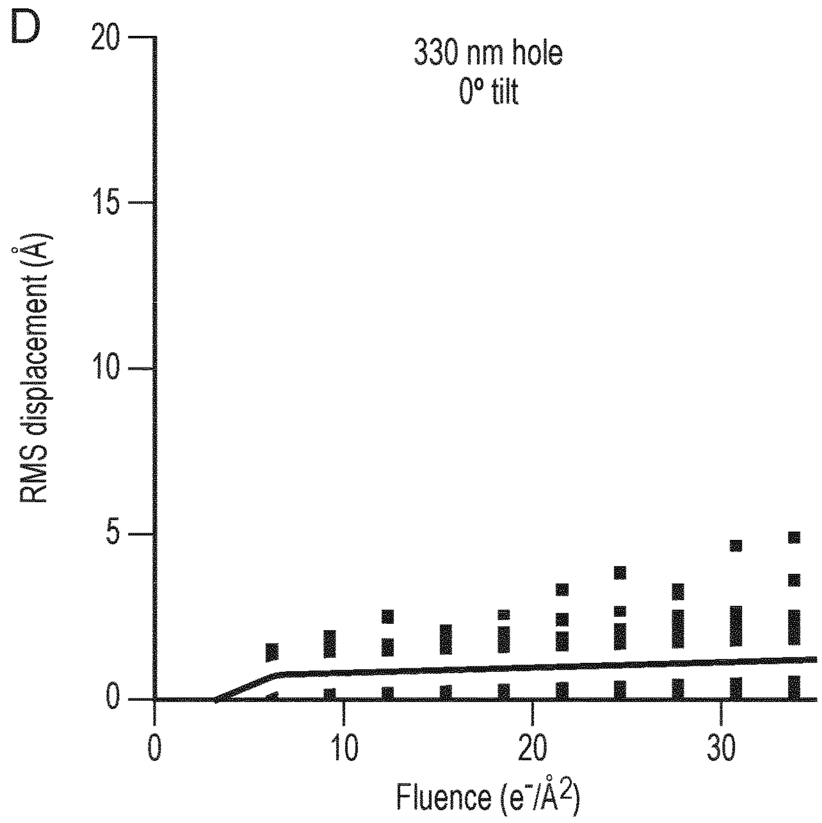
Figure 7:
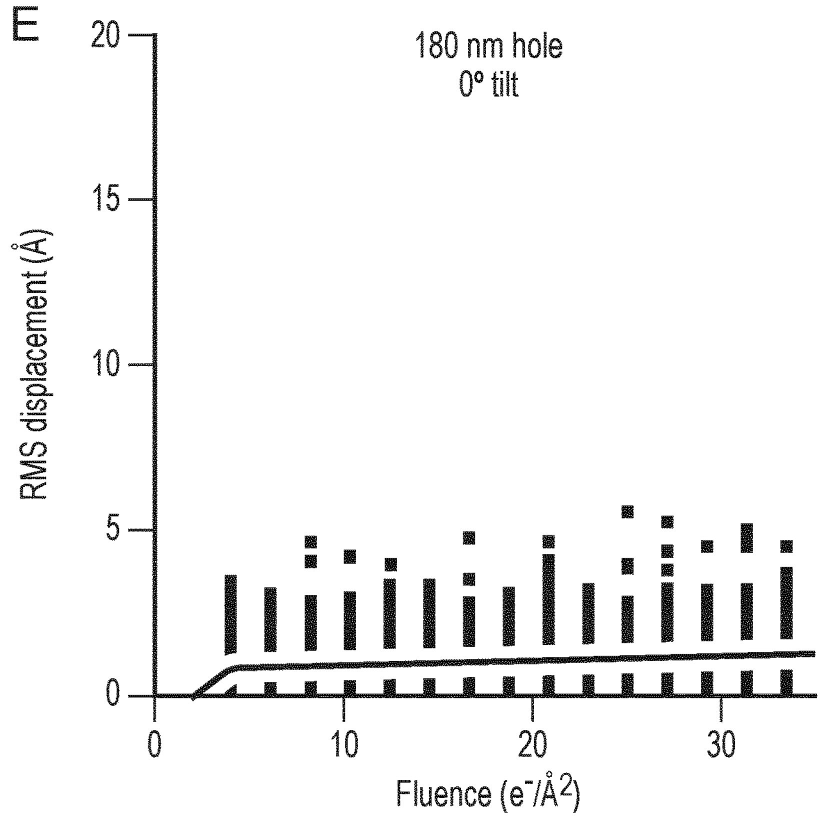
Figure 7:
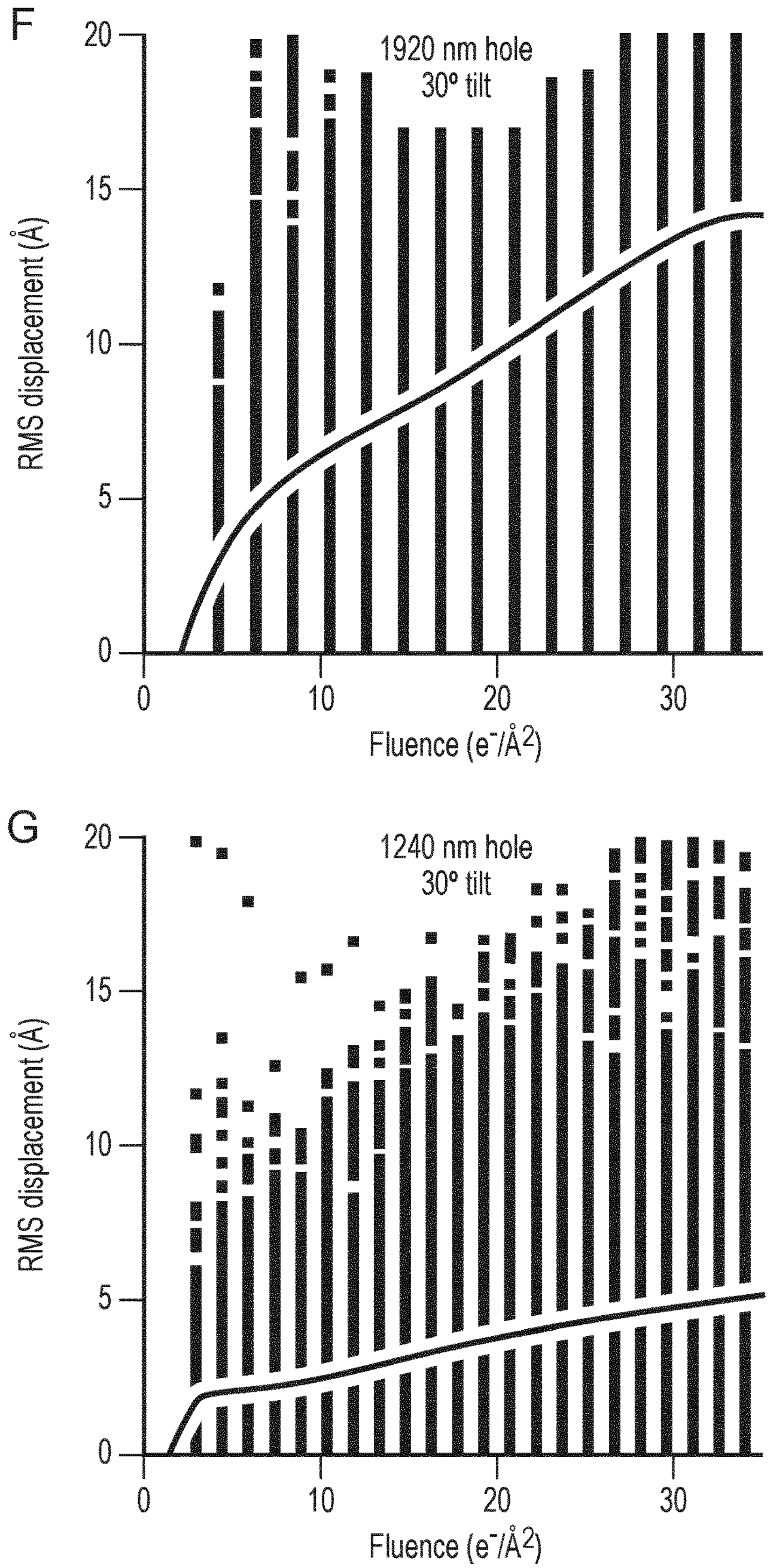
Figure 7:
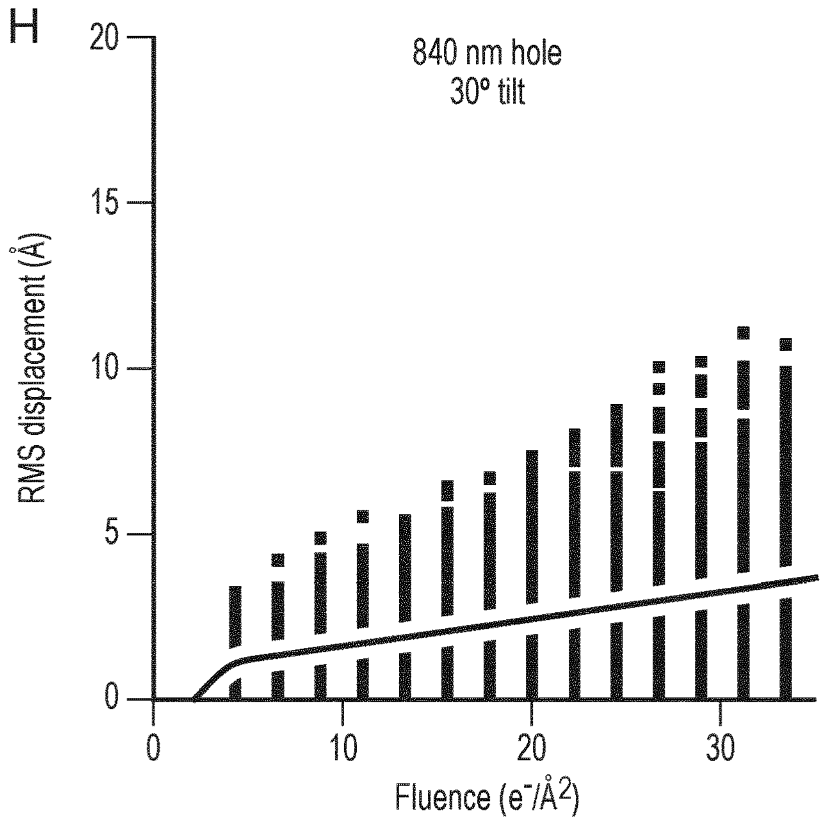
Figure 7:
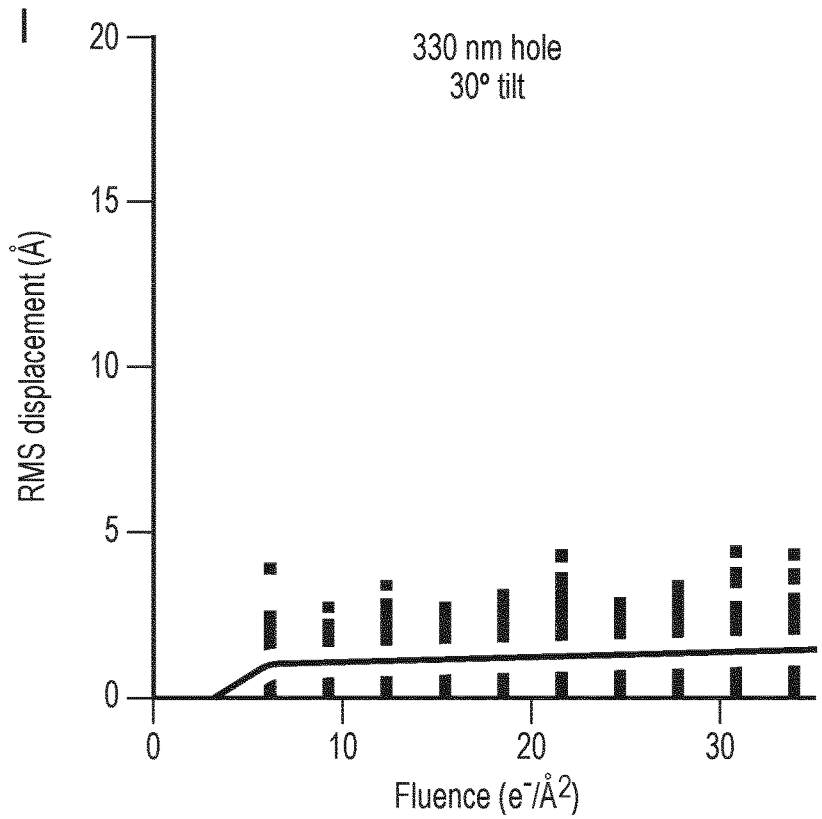
Figure 7:
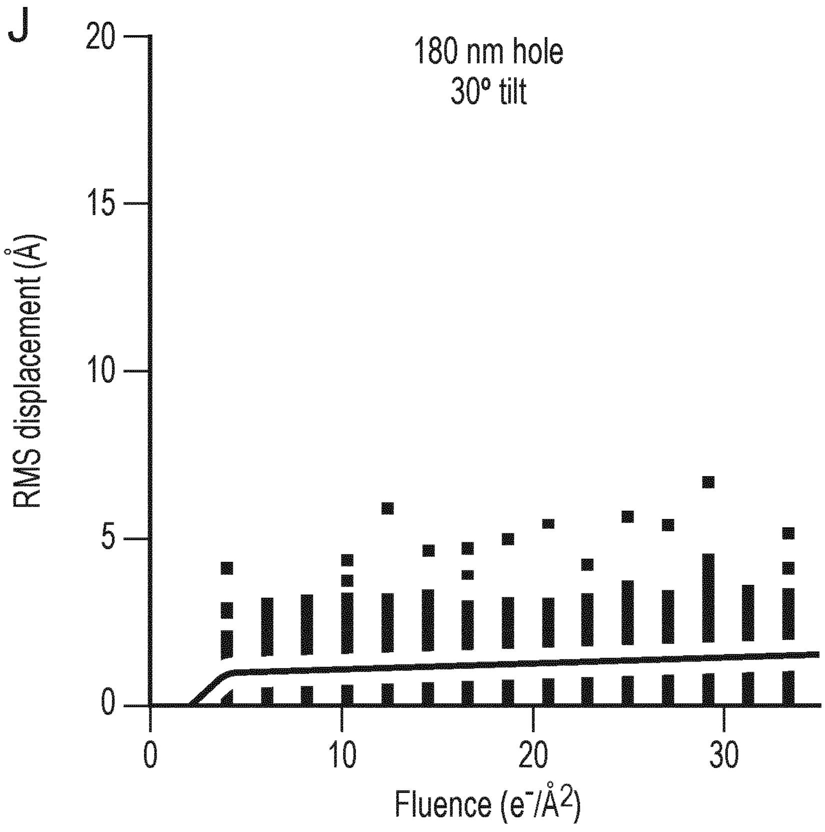
Figure 8:
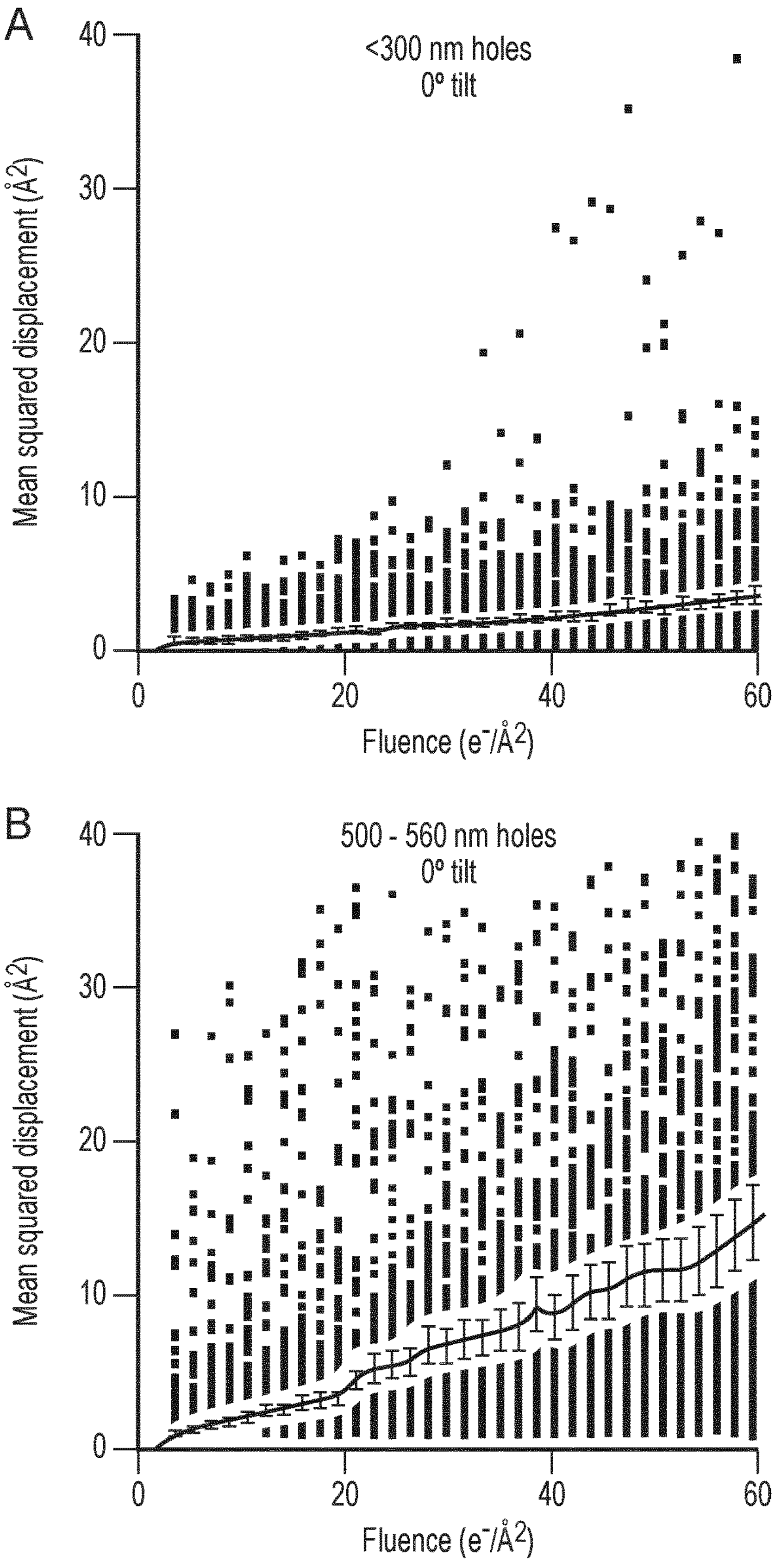
FIG. 8 shows movement tracking on the same grid with varying hole sizes. Mean squared displacements of particles in holes smaller than 300 nm, imaged at 0° (A) and 30° (C) tilt, and in holes with diameters in the 500 to 560 nm range, imaged under identical conditions (B and D). The movement of the particles in the smaller holes appears to be fully diffusive, whereas the particles in the larger holes move as expected from the buckling model.
Figure 8:
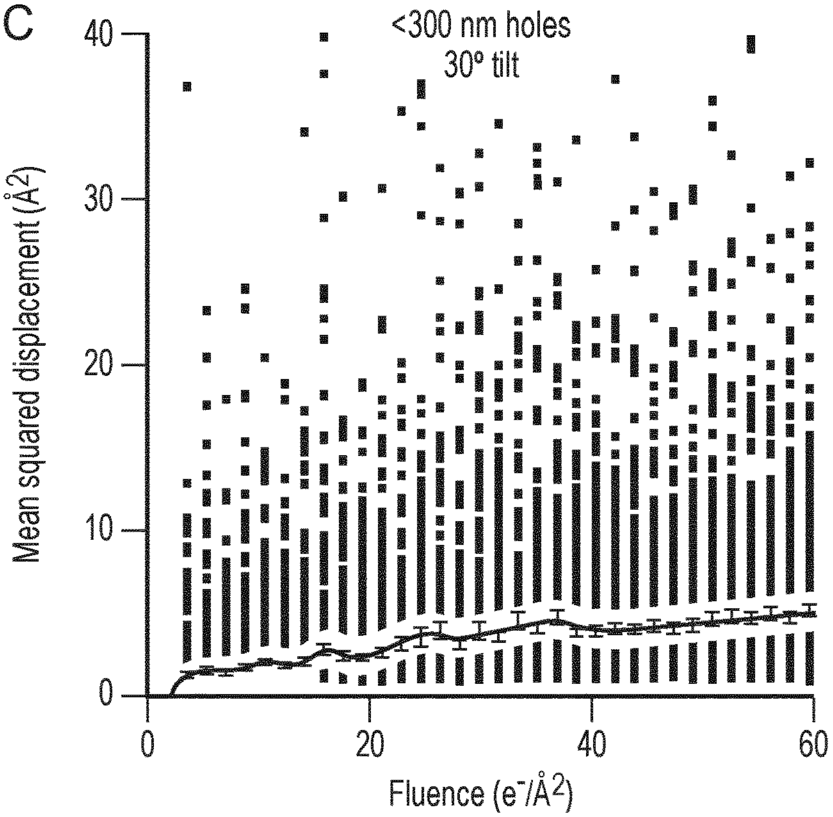
Figure 8:
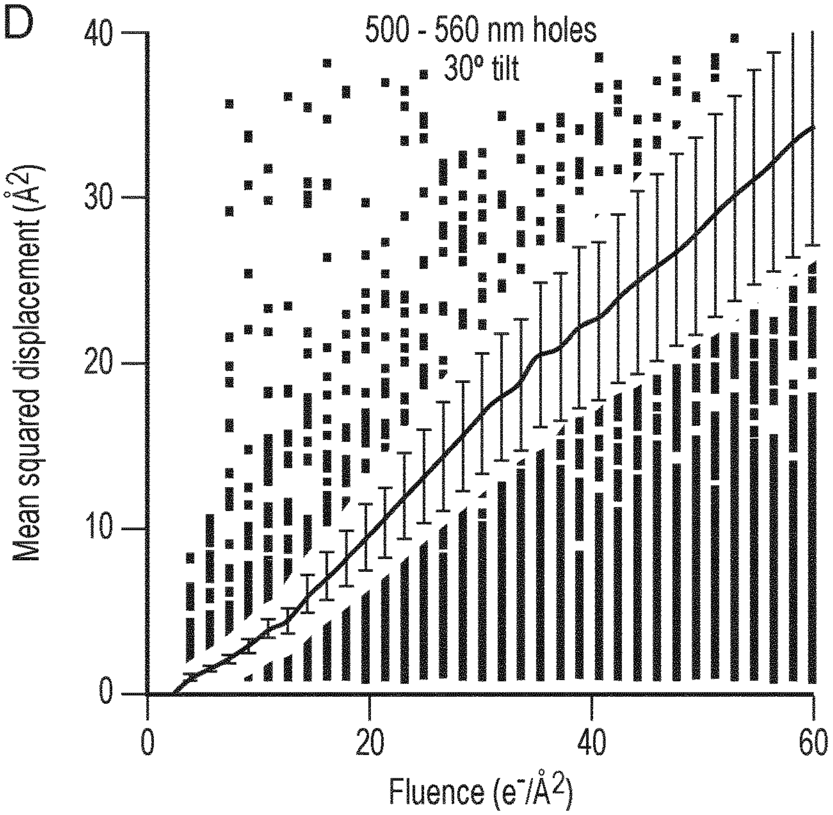
Figure 9:
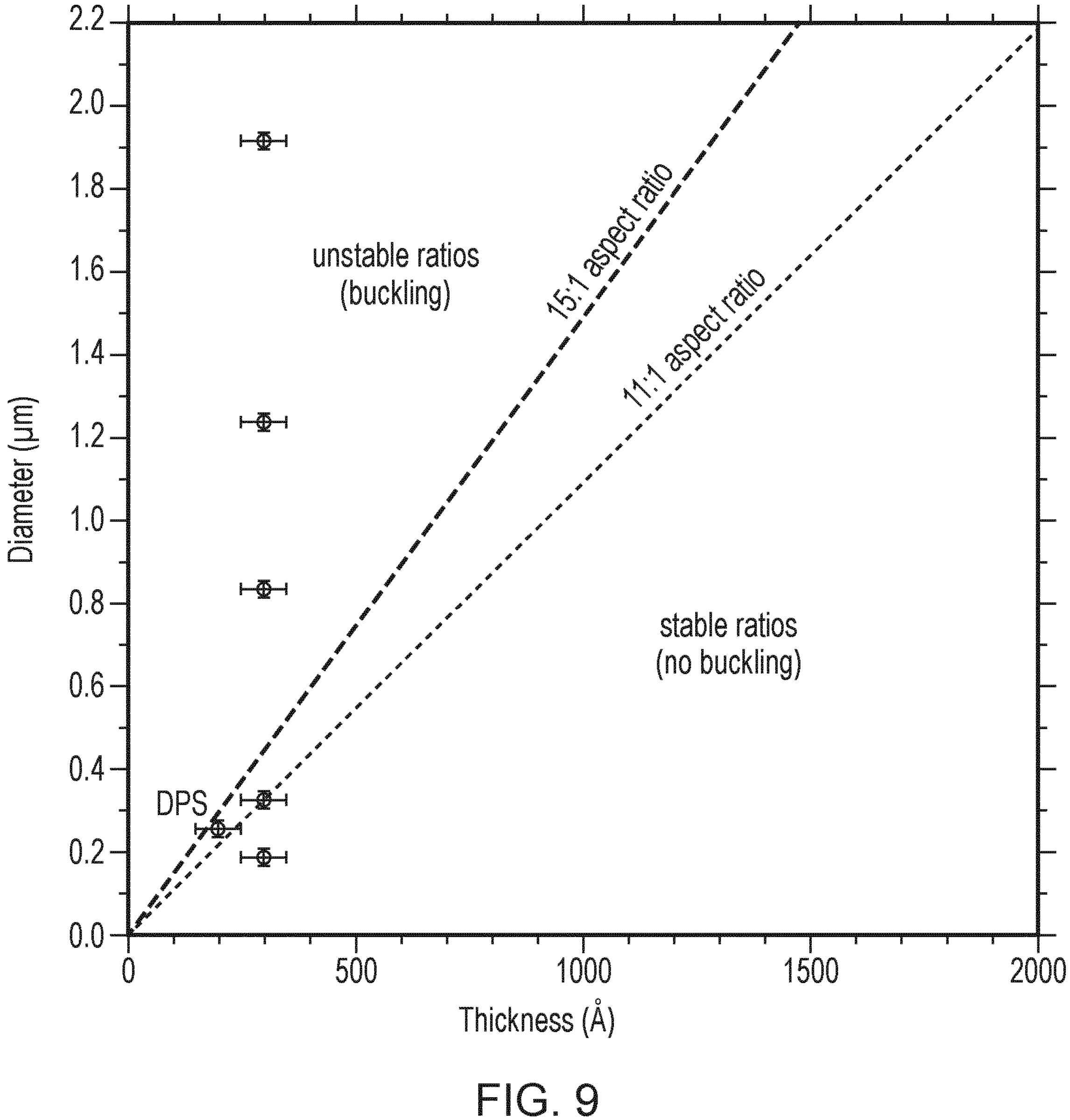
FIG. 9 shows optimal aspect ratio determination for the stability of suspended ice films. The darkest shaded region indicates the range of hole diameter and ice thickness combinations which are fully expected to be stable when vitrified in liquid ethane at about 90K and imaged with electrons at liquid nitrogen temperature. The combinations of hole diameters and ice thicknesses which lie in the white region are expected to be unstable due to buckling during vitrification. The dashed line shows the largest stable hole diameter for a given ice thickness, and the dotted line is a more conservative estimate of the same threshold. These lines are only indicative limits. There is some variability in the slopes due to ice thickness variations within the holes, hole shape variations, and uncertainty in the Poisson ratio of amorphous water. The different hole sizes and the corresponding ice thickness, in which gold nanoparticles were tracked in this work, are shown with black markers. The hole diameter and ice thickness for the DPS dataset in particular is labelled.

Gold foils produced by the sputtering method in Janbroers et al. 2009 also suffer from this porosity, besides not being made from pure gold. The pores are clear in FIG. 1C and FIG. 5. This is in contrast to the present foils which do not have such pores.

Although the data provided herein relates to gold, similar improvements are expected to be seen in materials having similar structural and electrical properties such as transition metals, aluminium, beryllium and degenerately doped silicon having a second element selected from boron, aluminium, phosphorus, and arsenic at a concentration of $10^{20}$ atoms/$cm^3$ or higher

REFERENCES

1. Ermantraut, E., Wohlfart, K. & Tichelaar, W. Perforated support foils with pre-defined hole size, shape and arrangement. Ultramicroscopy 74, 75-81 (1998).
2. Janbroers, S., de Kruijff, T. R., Xu, Q., Kooyman, P. J. & Zandbergen, H. W. Preparation of carbon-free TEM microgrids by metal sputtering. Ultramicroscopy 109, 1105-1109 (2009).
3. Russo, C. J. & Passmore, L. A. Ultrastable gold substrates for electron cryomicroscopy. Science 346, 1377-1380 (2014).
4. Russo, C. J. & Passmore, L. A. Ultrastable gold substrates: Properties of a support for high-resolution electron cryomicroscopy of biological specimens. Journal of Structural Biology 193, 33-44 (2016).
5. Grant-Jacob, J. A. et al. Design and fabrication of a 3D-structured gold film with nanopores for local electric field enhancement in the pore. Nanotechnology 27, 65302 (2015).
6. Jia, P. et al. Large-area freestanding gold nanomembranes with nanoholes. Materials Horizons 6, 1005-1012 (2019).
7. Naydenova, K., Peet, M. J. & Russo, C. J. Multifunctional graphene supports for electron cryomicroscopy. Proceedings of the National Academy of Sciences 201904766 (2019) doi:10.1073/pnas.1904766116.

The invention claimed is:

1. A support for an electron microscopy sample, the support comprising a metallic foil having one or more holes therethrough wherein thickness of the metallic foil is less than 50 nm and/or the mean linear intercept grain size is 50 nm or less, wherein the ratio of the diameter of each hole to the thickness of the metallic foil is 15:1 or less, and wherein the metallic foil consists of either (a) one or more metals selected from transition metals, aluminium and beryllium, or an alloy thereof; or (b) degenerately doped silicon wherein the dopant element is selected from boron, aluminium, boron and arsenic at a concentration of $10^{20}$ atoms/$cm^3$ or higher.

2. A support according to claim 1 wherein thickness of the metallic foil is less than 50 nm and the mean linear intercept grain size is 50 nm or less.

3. A support according to claim 1 wherein the edge roughness of each hole is 20 nm or less as measured by the root mean square deviation from the expected theoretical hole edge profile.

4. A support according to claim 1 wherein the diameter of each hole is 750 nm or less.

5. A support according to claim 1 wherein the support has a light wavelength transmittance maximum of from 650 to 800 nm.

6. A support according to claim 1 wherein the holes are arranged in a hexagonal array or a square pattern array.

7. A support according to claim 1 wherein the metallic foil is suspended across holes in an electron microscopy grid.

8. A support according to claim 7 wherein the metallic foil and the grid are integrally formed.

9. A support according to claim 7 wherein the grid comprises a mesh having a mean hole size that is on a micrometre scale and the mesh holes are tessellating hexagons or tessellating squares.

10. A support according to claim 1 wherein the metallic foil consists of one or more of gold, palladium and platinum or an alloy thereof, optionally wherein the metallic foil consists of gold or an alloy thereof.

11. A support according to claim 1 wherein the support consists of one or more of gold, palladium and platinum or an alloy thereof, optionally wherein the support consists of gold or an alloy thereof.

12. A method of manufacturing a metallic foil for a support according to claim 1, the method comprising the steps of depositing a metallic layer onto a patterned substrate that is cooled to 200K or less to form a layer having a thickness of 50 nm or less and having one or more holes therethrough; removing the deposited metallic layer; and forming the metallic layer into a support for an electron microscopy sample, wherein the metallic foil consists of either (a) one or more metals selected from transition metals, aluminium and beryllium, or an alloy thereof; or (b) degenerately doped silicon wherein the dopant element is selected from boron, aluminium, boron and arsenic at a concentration of $10^{20}$ atoms/$cm^3$ or higher.

13. A method of electron microscopy imaging comprising a step of sequentially imaging a sample suspended in a hole of a support according to claim 1, wherein each image encompass at least a part of the edge of the hole and the electron beam encompasses the hole and the complete edge of the hole.

14. A method of electron microscopy imaging according to claim 13 wherein at least a part of the edge of the hole in each image is compared to the other images to remove any relative shift between sequential images and/or wherein the sequential images of the specimen in the hole are weighted to account for damage to the specimen.

15. A support according to claim 1 wherein the metallic foil and the support each independently consists of one or more of gold, palladium and platinum or an alloy thereof.

16. A support according to claim 1 wherein the metallic foil and the support both consist of the same material selected from one or more of gold, palladium and platinum or an alloy thereof.

17. A support according to claim 1 wherein the metallic foil and the support both consist of gold or an alloy thereof.

* * * * *